(12) United States Patent
Jo et al.

(10) Patent No.: US 9,355,961 B2
(45) Date of Patent: May 31, 2016

(54) SEMICONDUCTOR DEVICES HAVING THROUGH-ELECTRODES AND METHODS FOR FABRICATING THE SAME

(71) Applicant: SAMSUNG ELECTRONICS CO., LTD., Suwon-si (KR)

(72) Inventors: Chajea Jo, Incheon (KR); Taeje Cho, Hwaseong-si (KR); Hyunsoo Chung, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 14/470,366

(22) Filed: Aug. 27, 2014

(65) Prior Publication Data

US 2015/0123284 A1 May 7, 2015

(30) Foreign Application Priority Data

Nov. 7, 2013 (KR) .................... 10-2013-0134933

(51) Int. Cl.
*H01L 23/538* (2006.01)
*H01L 21/768* (2006.01)
*H01L 25/065* (2006.01)
*H01L 23/48* (2006.01)

(52) U.S. Cl.
CPC ...... *H01L 23/5384* (2013.01); *H01L 21/76879* (2013.01); *H01L 21/76898* (2013.01); *H01L 23/481* (2013.01); *H01L 25/0657* (2013.01); *H01L 2224/16145* (2013.01); *H01L 2224/16225* (2013.01); *H01L 2924/15311* (2013.01)

(58) Field of Classification Search
CPC ............ H01L 23/5384; H01L 21/76879; H01L 25/0657; H01L 21/76898; H01L 23/481; H01L 2224/16145; H01L 2224/16225; H01L 2924/15311

See application file for complete search history.

(56) References Cited

U.S. PATENT DOCUMENTS

| 5,270,261 | A | 12/1993 | Bertin et al. |
| 5,753,536 | A | 5/1998 | Sugiyama et al. |
| 7,282,444 | B2 | 10/2007 | Tanida et al. |
| 8,048,766 | B2 | 11/2011 | Joly et al. |
| 8,466,062 | B2 | 6/2013 | Lu et al. |
| 8,487,431 | B2 | 7/2013 | Jin et al. |

(Continued)

FOREIGN PATENT DOCUMENTS

| KR | 10-2007-0056670 A | 6/2007 |
| KR | 10-2013-0035442 A | 4/2013 |

*Primary Examiner* — Yasser A Abdelaziez
*Assistant Examiner* — Farun Lu
(74) *Attorney, Agent, or Firm* — Sughrue Mion, PLLC

(57) ABSTRACT

A semiconductor device having through-electrodes and methods for fabricating the same are provided. The semiconductor device may include a first semiconductor chip including a first active surface on which a first top pad is provided; a second semiconductor chip including a second active surface on which a second top pad is provided and a second inactive surface on which a second bottom pad is provided, the second semiconductor chip being stacked on the first semiconductor chip with the second active surface facing the first active surface; and a conductive interconnection configured to electrically connect the chips. The conductive interconnection includes a first through-electrode that penetrates the second semiconductor chip and electrically connects the second bottom pad to the second top pad; and a second through-electrode that passes through the second top pad without contacting the second top pad, and electrically connects the second bottom pad to the first top pad.

21 Claims, 34 Drawing Sheets

(56) References Cited

U.S. PATENT DOCUMENTS

| | | |
|---|---|---|
| 8,514,308 B2 | 8/2013 | Itonaga et al. |
| 2005/0151228 A1 | 7/2005 | Tanida et al. |
| 2005/0224921 A1 | 10/2005 | Gupta et al. |
| 2006/0252229 A1 | 11/2006 | Joly et al. |
| 2008/0286899 A1 | 11/2008 | Jung |
| 2011/0057321 A1 | 3/2011 | Wang et al. |
| 2011/0157445 A1 | 6/2011 | Itonaga et al. |
| 2011/0291266 A1 | 12/2011 | Jin et al. |
| 2012/0193785 A1* | 8/2012 | Lin et al. ............... 257/737 |
| 2013/0105968 A1 | 5/2013 | Lu et al. |

* cited by examiner

SEMICONDUCTOR DEVICES HAVING THROUGH-ELECTRODES AND METHODS FOR FABRICATING THE SAME

CROSS-REFERENCE TO RELATED APPLICATIONS

This application claims priority from Korean Patent Application No. 10-2013-0134933 filed on Nov. 7, 2013, the entire contents of which are hereby incorporated by reference.

BACKGROUND

Apparatuses, devices, methods, and articles of manufacture consistent with the present disclosure relate to semiconductors and, more particularly, to semiconductor devices having through-electrodes and methods for fabricating the same.

Through-electrodes are suggested to electrically connect a semiconductor device to another semiconductor device or a printed circuit board. The through-electrode can be used to create three-dimensional structures and can accomplish high speed data transmission compared to related art solder balls or solder bumps. It is common practice to thin a semiconductor wafer when stacking the semiconductor devices having through-electrodes. The thinning process generally uses a carrier for easy handling of wafer. However, using a carrier has a disadvantage in that it induces a high cost due to the requirement of attaching/detaching the carrier. In addition, there is another disadvantage in that the formation of through-electrodes may create difficulty with good alignment of the through-electrodes.

SUMMARY

One or more exemplary embodiments provide semiconductor devices having through-electrodes and methods for fabricating the same in which the semiconductor chips are stacked without damage to the wafers.

One or more exemplary embodiments also provide semiconductor devices having through-electrodes and methods for fabricating the same capable of excellently aligning the through-electrodes.

One or more exemplary embodiments also provide semiconductor devices having through-electrodes and methods for fabricating the same in which the thinned wafer can be easily handled without using a carrier.

According to an aspect of an exemplary embodiment, there is provided a semiconductor device including a first semiconductor chip including a first active surface on which a first top pad is provided; a second semiconductor chip including a second active surface on which a second top pad is provided and a second inactive surface on which a second bottom pad is provided, the second semiconductor chip being stacked on the first semiconductor chip with the second active surface facing the first active surface; and a conductive interconnection configured to electrically connect the first semiconductor chip to the second semiconductor chip, wherein the conductive interconnection includes: a first through-electrode that penetrates the second semiconductor chip and electrically connects the second bottom pad to the second top pad; and a second through-electrode that penetrates the second semiconductor chip, passes through a horizontal plane of the second top pad without contacting the second top pad, and electrically connects the second bottom pad to the first top pad.

The second top pad may have an L shape having a first portion extending in a first horizontal axis and a second portion extending in a second horizontal axis perpendicular to the first horizontal axis, and the second through-electrode vertically extends between the first and second portions.

The second bottom pad may have an L shape that is horizontally rotated 90 degrees relative to the L-shape of the second top pad, and the second bottom pad is vertically aligned with the second top pad.

The second through-electrode may be provided between the first top pad and second bottom pad, and the first through-electrode may be arranged spaced apart from the second through-electrode along the at least one of the first and second horizontal axes.

The second through-electrode may be provided between the first top pad and the second bottom pad, and the first through-electrode may be arranged spaced apart from the second through-electrode along a diagonal horizontal axis between the first and second horizontal axes.

The device may further include an insulating adhesive layer between the first active surface of the first semiconductor chip and the second active surface of the second semiconductor chip, wherein the second through-electrode further penetrates the insulating adhesive layer to be connected to the first top pad.

The first semiconductor chip may have a thickness identical to or greater than a thickness of the second semiconductor chip.

The first semiconductor chip may further include a first bottom pad on a first inactive surface opposite the first active surface; and a through-electrode penetrating the first semiconductor chip to electrically connect the first top pad to the first bottom pad.

The device may further include a third semiconductor chip including a third active surface on which a third top pad is disposed and a third inactive surface on which a third bottom pad is disposed, the third semiconductor chip being stacked on the second semiconductor chip with the third active surface facing the second inactive surface, wherein the conductive interconnection further includes: a third through-electrode that penetrates the third semiconductor chip and electrically connects the third bottom pad to the third top pad; and a fourth through-electrode that penetrates the third semiconductor chip, passes through a horizontal plane of the third top pad without contacting the third top pad, and electrically connects the third bottom pad to the second bottom pad.

The third top pad may have an L shape having a first portion extending in a first horizontal axis and a second portion extending in a second horizontal axis perpendicular to the first horizontal axis, and the fourth through-electrode vertically extends between the first and second portions.

The second bottom pad may have an L shape that is horizontally rotated 90 degrees relative to the L-shape of the third top pad along one of the first and second horizontal axes, and the second bottom pad is vertically aligned with the third top pad.

The device may further include an insulating adhesive layer between the second inactive surface of the second semiconductor chip and the third active surface of the third semiconductor chip, wherein the fourth through-electrode further penetrates the insulating adhesive layer to be connected to the second bottom pad.

The first semiconductor chip may have a thickness greater than a thickness of at least one of the second and third semiconductor chip.

According to an aspect of another exemplary embodiment, there is provided a method for fabricating a semiconductor device, the method including providing a first semiconductor chip including a first active surface on which a first top pad is disposed and a first inactive surface opposite the first active surface; forming a first adhesive layer on the first active surface of the first semiconductor chip; providing on the first adhesive layer a second semiconductor chip including a second active surface on which a second top pad is disposed and a second inactive surface opposite the second active surface such that the second active surface faces the first active surface; grinding the second inactive surface to thin the second semiconductor chip; forming a first conductive interconnection including a first through-electrode that penetrates the thinned second semiconductor chip and is connected to the second top pad, and a second through-electrode that penetrates the thinned second semiconductor chip and the first adhesive layer, and is connected to the first top pad; and forming a second bottom pad on the grinded second inactive surface, the second bottom pad being connected to the first conductive interconnection, wherein the second through-electrode passes through a plane of the second top pad without contacting the second top pad.

The forming the first conductive interconnection may include selectively etching the thinned second semiconductor chip and the first adhesive layer to form a via hole including a first hole that penetrates the second semiconductor chip to expose the second top pad and a second hole that penetrates the second semiconductor chip and the first adhesive layer to expose the first top pad; forming a via insulating layer extending along an inner side of the via hole and covering the grinded second inactive surface; removing a portion of the via insulating layer to expose a portion of the second top pad and a portion of the first top pad; forming a conductive layer filling the via hole on the grinded second inactive surface; and planarizing the conductive layer until the via insulating layer is exposed to form the first through-electrode filling the first hole and the second through-electrode filling the second hole.

The second top pad may have an L shape including a first portion extending in a first horizontal axis and a second portion extending in a second horizontal axis perpendicular to the first horizontal axis, and the second bottom pad has an L shape that is horizontally rotated 90 degrees relative to the L-shape of the second top pad and is vertically aligned with the second top pad.

The first through-electrode may be disposed between the second top pad and the second bottom pad, the second through-electrode may be disposed spaced apart from the first though electrode between the second bottom pad and the first top pad, and the second through-electrode may be arranged along one of the first and second horizontal axes from the first through-electrode, or along a diagonal horizontal axis between the first and second horizontal axes from the first through-electrode.

The method may further include forming a second adhesive layer on the grinded second inactive surface; providing on the second adhesive layer a third semiconductor chip including a third active surface on which a third top pad is disposed and a third inactive surface opposite the third active surface such that the third active surface faces the grinded second inactive surface; grinding the third inactive surface to thin the third semiconductor chip; forming a second conductive interconnection including a third through-electrode that penetrates the thinned third semiconductor chip to be connected to the third top pad and a fourth through-electrode that penetrates the thinned third semiconductor chip and further penetrates the second adhesive layer to be connected to the second bottom pad; and forming a third bottom pad on the grinded third inactive surface, the third bottom pad being connected to the second conductive interconnection, wherein the third top pad has an L shape having a first portion extending in a first horizontal axis and a second portion in a second horizontal axis perpendicular to the first horizontal axis, and is vertically aligned with the second bottom pad, and wherein the fourth through-electrode vertically passes between the first and second portions of the third top pad without contacting therewith.

The method may further include grinding the first inactive surface to thin the first semiconductor chip.

The method may further include forming an additional through-electrode that penetrates the thinned first semiconductor chip to be connected to the first top pad; and forming a first bottom pad on the grinded first inactive surface to be connected to the additional through-electrode.

BRIEF DESCRIPTION OF THE DRAWINGS

The foregoing and other aspects will be apparent from the more particular description of non-limiting exemplary embodiments, as illustrated in the accompanying drawings in which: 1

DETAILED DESCRIPTION

Figure 1A:
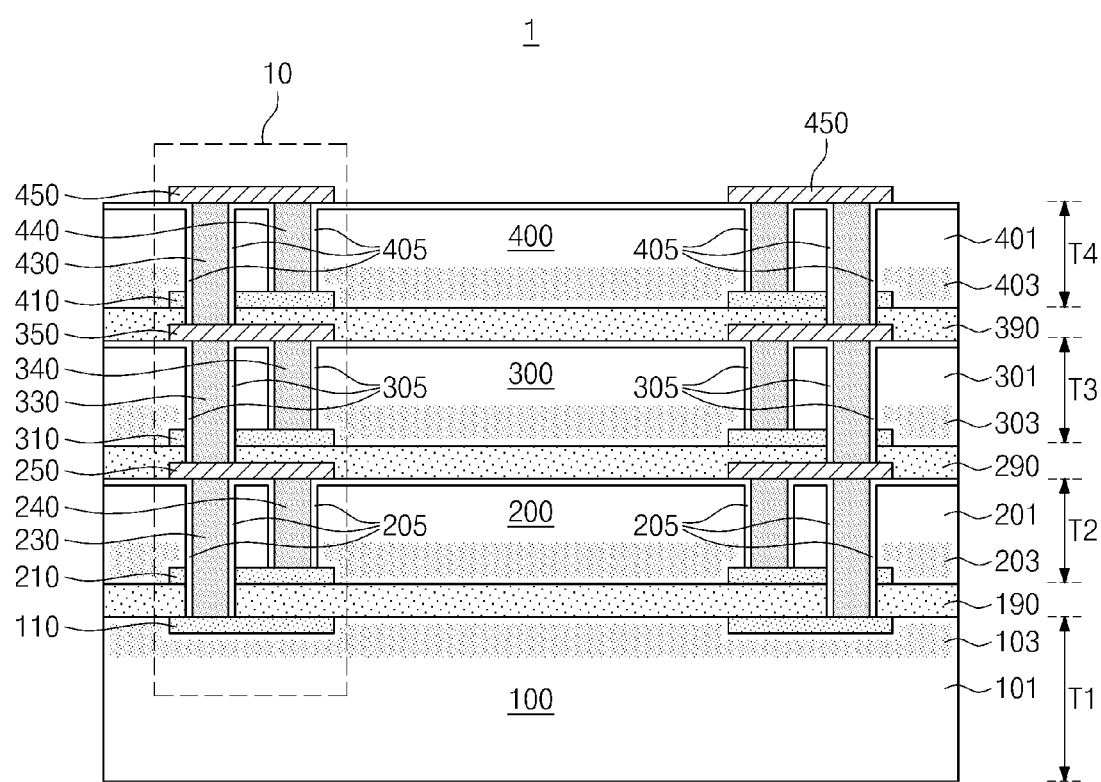
FIG. 1A is a cross-sectional view illustrating a semiconductor device according to some exemplary embodiments.

Exemplary embodiments will now be described more fully hereinafter with reference to the accompanying drawings, in which some example exemplary embodiments are shown. In the drawings, like reference numbers refer to the same parts throughout the different views. The drawings are not necessarily to scale, emphasis instead being placed upon illustrating principles related to the exemplary embodiments. The present inventive concept, may, however, be embodied in many different forms and should not be construed as being limited to the exemplary embodiments set forth herein; rather, these exemplary embodiments are provided so that this disclosure will be thorough and complete, and will fully convey the scope of the exemplary embodiments to those of ordinary skill in the art. In the drawings, the thicknesses of layers and regions are exaggerated for clarity. Like reference numerals in the drawings denote like elements.

As used in this disclosure, the terms "first", "second", "third", and "fourth", etc. are used merely to distinguish elements from one another and thus do not denote any particular order unless an order is specifically described. For example, the term "second" may be used without using the term "first".

Although corresponding plan views and/or perspective views of some cross-sectional view(s) may not be shown, the cross-sectional view(s) of device structures illustrated herein provide support for a plurality of device structures that extend along two different directions as would be illustrated in a plan view, and/or in three different directions as would be illustrated in a perspective view. The two different directions may or may not be orthogonal to each other. The three different directions may include a third direction that may be orthogonal to the two different directions. The plurality of device structures may be integrated in a same electronic device. For example, when a device structure is illustrated in a cross-sectional view, an electronic device may include a plurality of the device structures, as would be illustrated by a plan view of the electronic device. The plurality of device structures may be arranged in an array and/or in a two-dimensional pattern.

Figure 1B:
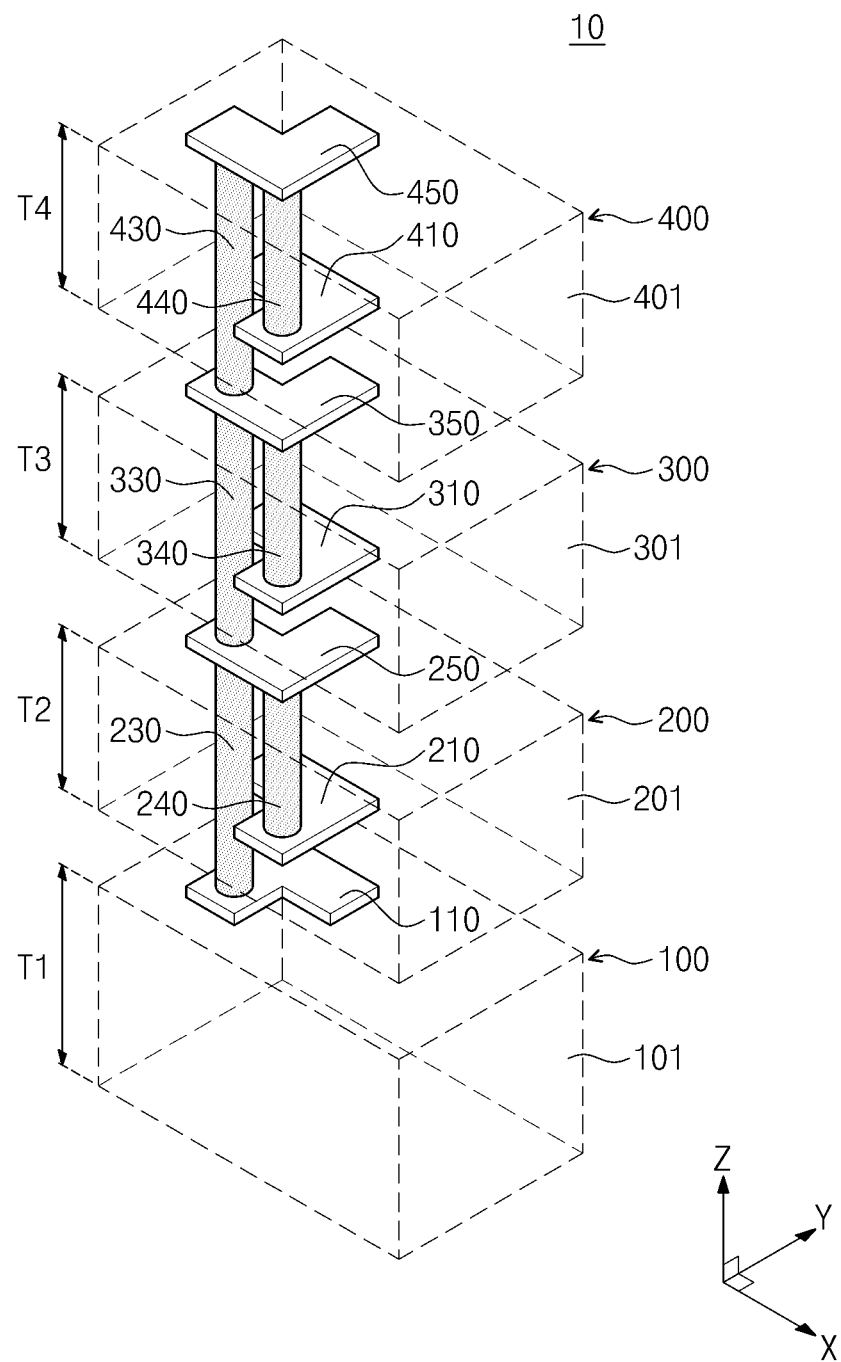
FIG. 1B is a perspective view of a portion of FIG. 1A.
Figure 1C:
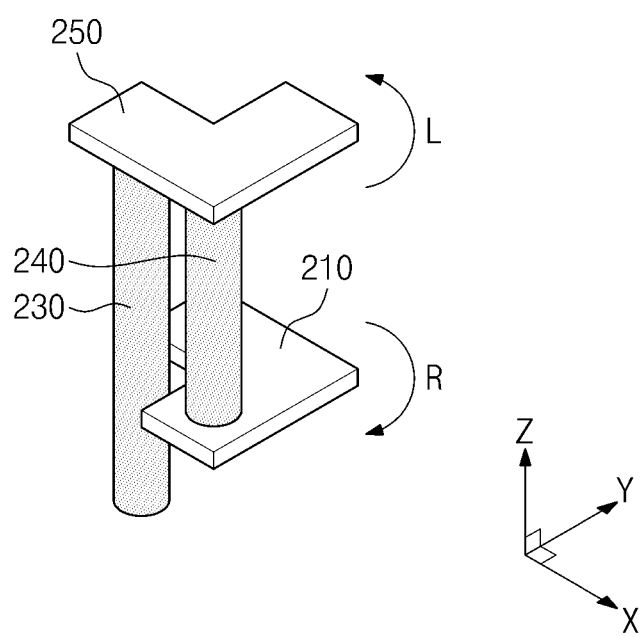
FIG. 1C is an enlarged perspective view of a portion of FIG. 1B.

FIG. 1A is a cross-sectional view illustrating a semiconductor device according to some exemplary embodiments. FIG. 1B is a perspective view of a portion of FIG. 1A. FIG. 1C is an enlarged perspective view of a portion of FIG. 1B.

Referring to FIG. 1A, a semiconductor device 1 may include a first semiconductor chip 100, a second semiconductor chip 200, a third semiconductor chip 300, and a fourth semiconductor chip 400 stacked on the first semiconductor chip 100, and a conductive interconnection 10 electrically connecting the first to fourth semiconductor chips 100, 200, 300 and 400 with each other. The first semiconductor chip 100, the second semiconductor chip 200, the third semiconductor chip 300, and the fourth semiconductor chip 400 may include a first integrated circuit 103, a second integrated circuit 203, a third integrated circuit 303, and a fourth integrated circuit 403, respectively. At least one of the first to fourth integrated circuits 103, 203, 303 and 403 may be a memory circuit, a logic circuit, or a combination thereof. However, the type of integrated circuit is not particularly limited.

The first to fourth semiconductor chips 100, 200, 300 and 400 may have a same thickness or different thicknesses. For example, a second thickness T2 of the second semiconductor chip 200 may be less than a first thickness T1 of the first semiconductor chip 100. A third thickness T3 of the third semiconductor chip 300 and a fourth thickness T4 of the fourth semiconductor chip 400 may be less than the first thickness T1 and identical or similar to the second thickness T2. As one example, each of the second to fourth semiconductor chips 200, 300 and 400 may be ground down on a backside thereof to have a thickness (e.g., about 50 µm to about 70 µm) which is less than the first thickness T1 of the first semiconductor chip 100. Alternatively, the first to fourth semiconductor chips 100, 200, 300 and 400 may have the same or similar thickness.

The second to fourth semiconductor chips 200, 300 and 400 may be stacked on the first semiconductor chip 100 in a flip-chip bonding method. For example, the second to fourth semiconductor chips 200, 300 and 400 in a face-down state may be stacked on the first semiconductor chip 100 in a face-up state. Consequently, the first and second semiconductor chips 100 and 200 may be bonded to have a face-to-face bonding structure; the second and third semiconductor chips 200 and 300 may be combined to have a back-to-face bonding structure; and the third and fourth semiconductor chips 300 and 400 may be united to have the back-to-face bonding structure.

The semiconductor device 1 may further include a first adhesive layer 190 between the first and second semiconductor chips 100 and 200, a second adhesive layer 290 between the second and third semiconductor chips 200 and 300, and a third adhesive layer 390 between the third and fourth semiconductor chips 300 and 400.

The first semiconductor chip 100 may include a first substrate 101 including the first integrated circuit 103 and a first top pad 110 electrically connected to the first integrated circuit 103. The first substrate 101 may include a semiconductor substrate such as a chip-level silicon wafer or a wafer-level silicon wafer.

The second semiconductor chip 200 may include a second substrate 201 including the second integrated circuit 203, a second top pad 210 electrically connected to the second integrated circuit 203, a second long through-electrode 230 penetrating the second substrate 201, a second short through-electrode 240 penetrating the second substrate 201, and a second bottom pad 250 (i.e., bottom with respect to the second semiconductor chip 200) electrically connected to the second long and short through-electrodes 230 and 240. As discussed above, the term "second" is used here merely to indicate that the elements of the integrated circuit 203, the long through-electrode 230, and short through-electrode 240, and the second bottom pad 250, for example, relate to the "second" semiconductor chip 200. In other words, the term "second" is used here to tie the layers together logically. That there may be no "first" described for a given particular element thus should not create any confusion or ambiguity. The second substrate 201 may include a semiconductor substrate such as a chip-level silicon wafer or a wafer-level silicon wafer. The second semiconductor chip 200 may further include a second via insulating layer 205 electrically insulating the second long and short through-electrodes 230 and 240 from the second substrate 201.

The second top pad 210 and the second bottom pad 250 may be vertically aligned with the first top pad 110. The second long through-electrode 230 may further penetrate the first adhesive layer 190 to be connected to the first top pad 110 such that the second semiconductor chip 200 may be electrically connected to the first semiconductor chip 100.

The third semiconductor chip 300 may include a third substrate 301 including the third integrated circuit 303, a third top pad 310 electrically connected to the third integrated circuit 303, a third long through-electrode 330 penetrating the third substrate 301, a third short through-electrode 340 penetrating the third substrate 301, and a third bottom pad 350 electrically connected to the third long and short through-electrodes 330 and 340. The third substrate 301 may include a semiconductor substrate such as a chip-level silicon wafer or a wafer-level silicon wafer. The third semiconductor chip 300 may further include a third via insulating layer 305 electrically insulating the third long and short through-electrodes 330 and 340 from the third substrate 301.

The third top pad 310 and the third bottom pad 350 may be vertically aligned with the second bottom pad 250. The third long through-electrode 330 may further penetrate the second adhesive layer 290 to be connected to the second bottom pad 250 such that the third semiconductor chip 300 may be electrically connected to the second semiconductor chip 200. The third long through-electrode 330 may be vertically aligned with the second long through-electrode 230, and the third short through-electrode 340 may be vertically aligned with the second short through-electrode 240.

The fourth semiconductor chip 400 may include a fourth substrate 401 including the fourth integrated circuit 403, a fourth top pad 410 electrically connected to the fourth integrated circuit 403, a fourth long through-electrode 430 penetrating the fourth substrate 401, a fourth short through-electrode 440 penetrating the fourth substrate 401, and a fourth bottom pad 450 electrically connected to the fourth long and short through-electrodes 430 and 440. The fourth substrate 401 may include a semiconductor substrate such as a chip-level silicon wafer or a wafer-level silicon wafer. The fourth semiconductor chip 400 may further include a fourth via insulating layer 405 electrically insulating the fourth long and short through-electrodes 430 and 440 from the fourth substrate 401.

The fourth top pad 410 and the fourth bottom pad 450 may be vertically aligned with the third bottom pad 350. The fourth long through-electrode 430 may further penetrate the third adhesive layer 390 to be connected to the third bottom pad 350 such that the fourth semiconductor chip 400 may be electrically connected to the third semiconductor chip 300. The fourth long through-electrode 430 may be vertically aligned with the third long through-electrode 330, and the fourth short through-electrode 440 may be vertically aligned with the third short through-electrode 340.

The first to fourth semiconductor chips 100, 200, 300 and 400 may be the same chip, for example, a memory chip or a logic chip. Alternatively, the first semiconductor chip 100 may be a logic chip, and the second to fourth semiconductor chips 200, 300 and 400 may be a memory chip. Alternatively, the first to fourth semiconductor chips 100, 200, 300, and 400 may each be a different type of chip from the others.

The conductive interconnection 10 may include the first to fourth top pads 110, 210, 310 and 410 that are vertically aligned with each other, the second to fourth bottom pads 250, 350 and 450 that are vertically aligned with each other, the second to fourth long through-electrodes 230, 330 and 430 that are vertically aligned with each other, and the second to fourth short through-electrodes 240, 340 and 440 that are vertically aligned with each other. The conductive interconnection 10 may partially or completely penetrate the semiconductor device 1. For example, the conductive interconnection 10 may vertically penetrate the second to fourth semiconductor chips 200, 300 and 400. It is noted that in FIG. 1A and the other figures which follow, via structures are shown on both the left-hand side and the right-hand side of FIG. 1A, but that the conductive interconnection 10 is labeled on the left-hand side. In the description that follows, it will be understood that the same description may be applied to the via structure on the right-hand side, but repeated description thereof has been omitted in order to maintain a concise description.

Referring to FIGS. 1B and 1C, the second top pad 210 may have an L shape including a portion extending in an X-axis (also referred to as a first horizontal axis) and another portion extending in a Y-axis (also referred to as a second horizontal axis) perpendicular to the X-axis. The second long through-electrode 230 may extend in a Z-axis (also referred to a vertical axis) to pass through the second top pad 210 without contacting therewith. The second bottom pad 250 may have a flipped L shape taken by flipping the second top pad 210 having the L shape along the X-axis, or rotating the second top pad 210 clockwise at an angle of 90° along an arrow R (see FIG. 1C). In other words, the second top pad 210 may have the L shape taken by flipping the second bottom pad 250 having the flipped L shape along the X-axis, or horizontally rotating the second bottom pad 250 counterclockwise at an angle of 90° along an arrow L (see FIG. 1C). The second long and short through-electrodes 230 and 240 may be arranged along the X-axis to be connected to the second bottom pad 250. The second bottom pad 250 may act as a contact pad to which the second long and short through-electrodes 230 and 240 are connected, and also act as a test pad to which an electrical test tool (e.g., a probe) may be connected.

The configurations of the second top and bottom pads 210 and 250 may be identically or similarly applicable to those of the third top and bottom pads 310 and 350 and also to those of the fourth top and bottom pads 410 and 450. For example, one of the third top and bottom pads 310 and 350 may have an L shape taken by flipping the other of the third top and bottom pads 310 and 350 along the X-axis, or horizontally rotating the other at an angle of 90°. One of the fourth top and bottom pads 410 and 450 may have an L shape taken by flipping the other of the fourth top and bottom pads 410 and 450 along the X-axis, or horizontally rotating the other at an angle of 90°. Likewise, the second bottom pad 250 may have the L shape taken by flipping the third top pad 310 along the X-axis, or horizontally rotating the third top pad 310 at an angle of 90°. The third bottom pad 350 may have the L shape taken by flipping the fourth top pad 410 along the X-axis, or horizontally rotating the fourth top pad 410 at an angle of 90°.

The first top pad 110 may have an arbitrary shape. For example, the first top pad 110 may have the L shape, a circular shape, an elliptical shape, or a polygonal shape. While the remaining pads have been described above as each having an L shape, this is only an illustration, and other shapes are contemplated.

According to some exemplary embodiments, the second to fourth long through-electrodes 230, 330 and 430 may electrically connect the first to fourth semiconductor chips 100, 200, 300 and 400 each other. As a result, solder balls or solder bumps between the first to fourth semiconductor chips 100, 200, 300 and 400 may be eliminated or the number thereof may be decreased.

Figure 2A:
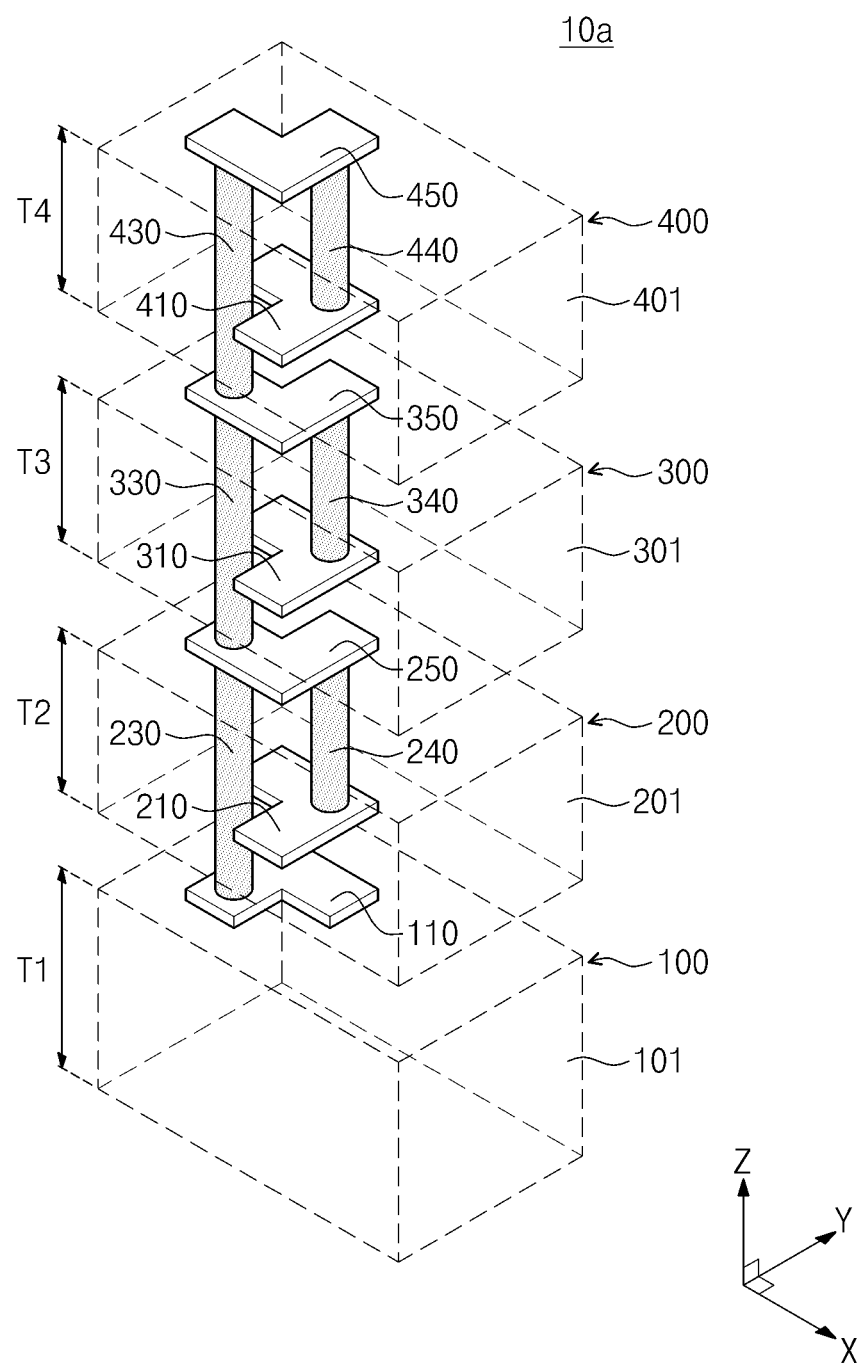
FIG. 2A is a perspective view illustrating another exemplary embodiment of FIG. 1B.
Figure 2B:
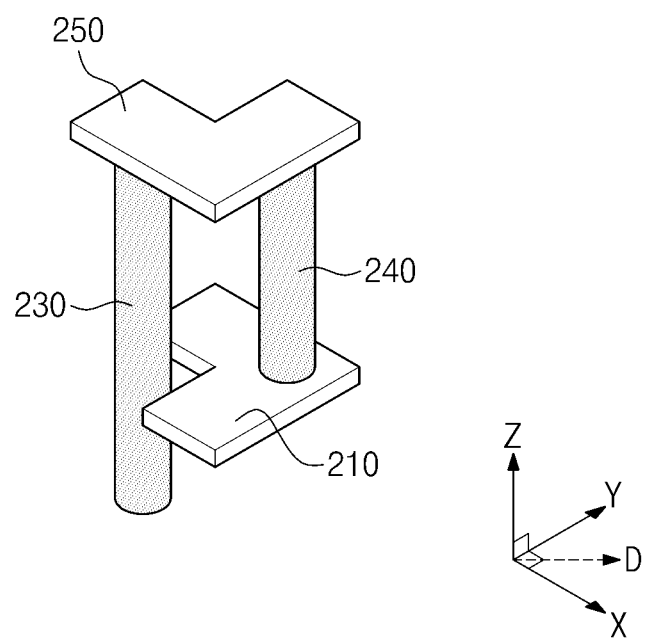
FIG. 2B is a partly enlarged perspective view of FIG. 2A.

FIG. 2A is a perspective view illustrating another exemplary embodiment of the configuration of FIG. 1B. FIG. 2B is a partly enlarged perspective view of FIG. 2A.

Referring to FIGS. 2A and 2B, the conductive interconnection 10a may have a structure similar to that of FIGS. 1B and 1C except that the second long and short through-electrodes 230 and 240 may be arranged along a diagonal axis (i.e., D-axis) between the X-axis and the Y-axis to be connected to both end parts of the second bottom pad 250. This exemplary embodiment may be employed in a case having a strong possibility of electrical short between the second long and short through-electrodes 230 and 240 due to shorter distance therebetween in the exemplary embodiment of FIGS. 1B and 1C. The configurations of the second long and short through-electrodes 230 and 240 may be identically or similarly applicable to those of the third long and short through-electrodes 330 and 340 and also to those of the fourth long and short through-electrodes 430 and 440.

Figure 3A:
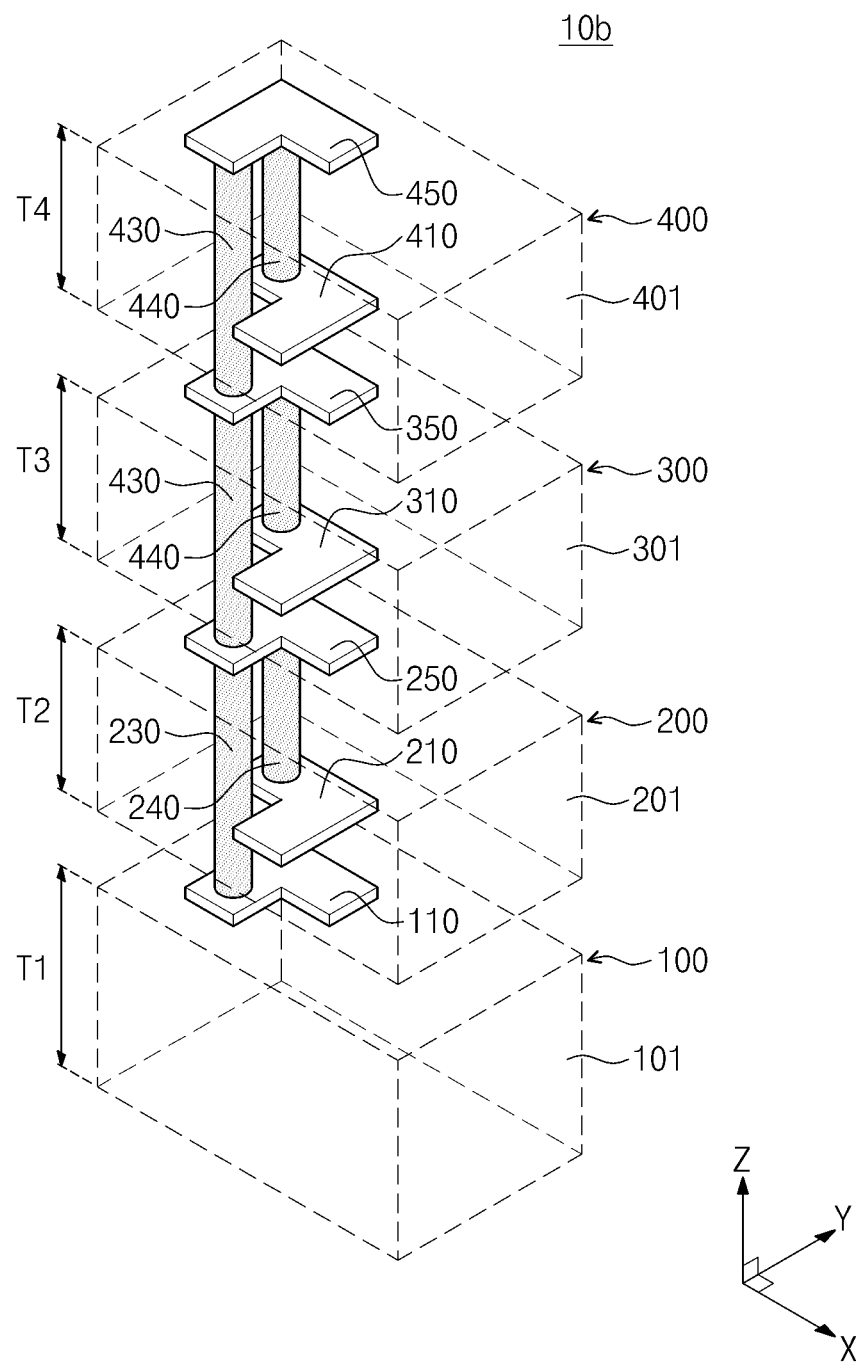
FIG. 3A is a perspective view illustrating yet another exemplary embodiment of FIG. 1B.
Figure 3B:
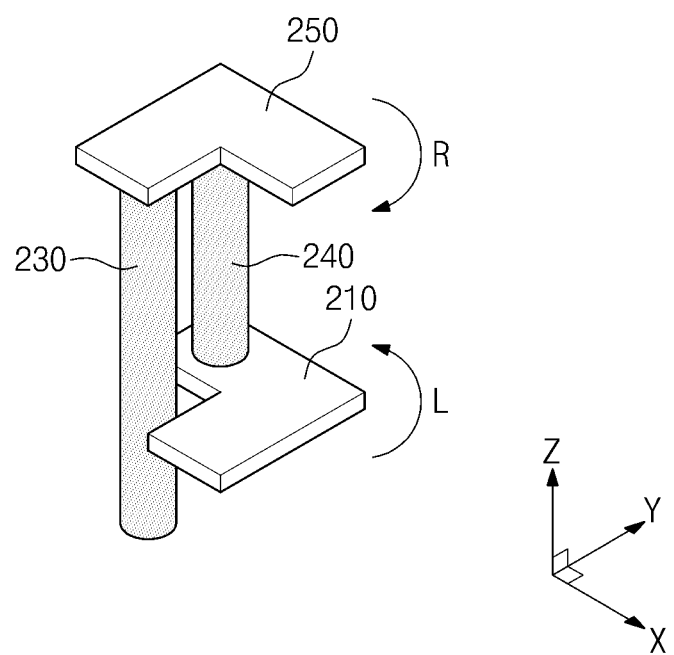
FIG. 3B is a partly enlarged perspective view of a portion of FIG. 3A.

FIG. 3A is a perspective view illustrating another exemplary embodiment of the configuration of FIG. 1B. FIG. 3B is a partly enlarged perspective view of a portion of FIG. 3A.

Referring to FIGS. 3A and 3B, the conductive interconnection 10b may include the second top pad 210 and the second bottom pad 250 that are flipped along the Y-axis or rotationally symmetric at an angle of 90°. For example, the second bottom pad 250 may have the flipped L shape taken by flipping the L shape of the second top pad 210 along the Y-axis, or horizontally rotating the second top pad 210 counterclockwise along the arrow L at an angle of 90°. In other words, the second top pad 210 may have the L shape taken by flipping the flipped L shape of the second bottom pad 250 along the Y-axis, or horizontally rotating the second bottom pad 250 clockwise along the arrow R (see FIG. 3C) at an angle of 90°. The second long and short through-electrodes 230 and 240 may be arranged along the Y-axis to be connected to the second bottom pad 250. Alternatively, the second long and short through-electrodes 230 and 240 may be arranged along the D-axis between the X-axis and the Y-axis. The configurations of the second top and bottom pads 210 and 250 may be identically or similarly applicable to those of the third top and bottom pads 310 and 350 and also to those of the fourth top and bottom pads 410 and 450.

Figure 4A:
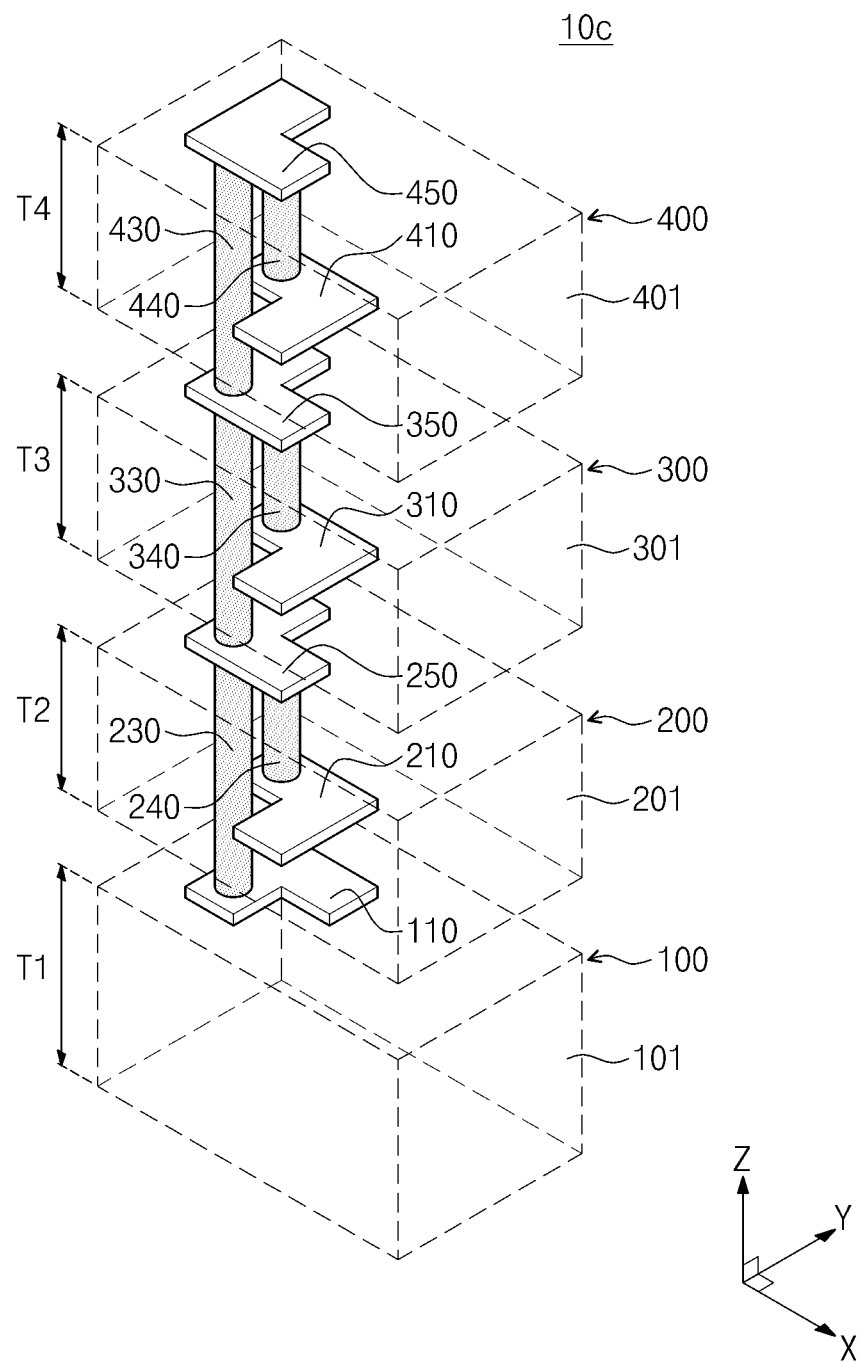
FIG. 4A is a perspective view illustrating yet another exemplary embodiment of FIG. 1B.
Figure 4B:
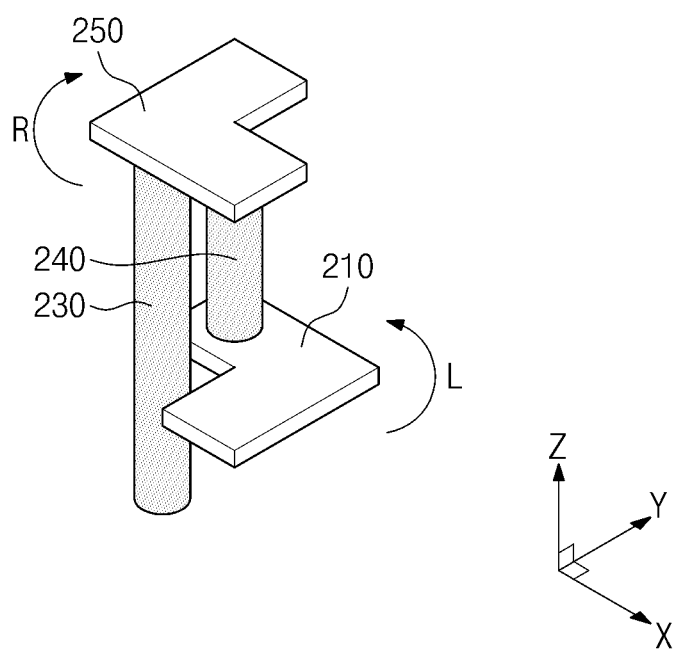
FIG. 4B is a partly enlarged perspective view of a portion of FIG. 4A.

FIG. 4A is a perspective view illustrating other exemplary embodiment of the configuration of FIG. 1B. FIG. 4B is a partly enlarged perspective view of a portion of FIG. 4A.

Referring to FIG. 4A, a conductive interconnection 10c may include the second top pad 210 and the second bottom pad 250 that are doubly flipped along the X-axis and Y-axis, or rotationally symmetric at an angle of 180°. In other words, the second bottom pad 210 may have the rotationally symmetric L shape taken by horizontally rotating the L shape of the second bottom pad 250 clockwise along the arrow R (see FIG. 4B) at an angle of 180°. The second long and short through-electrodes 230 and 240 may be arranged along the Y-axis to be connected to the second bottom pad 250. The configurations of the second top and bottom pads 210 and 250 may be identically or similarly applicable to those of the third top and bottom pads 310 and 350 and also to those of the fourth top and bottom pads 410 and 450.

Figure 5A:
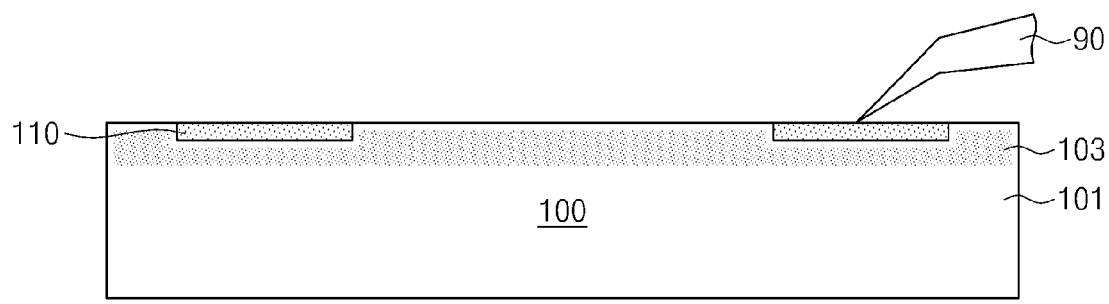
FIGS. 5A to 5N are cross sectional views illustrating a method for fabricating a semiconductor device according to some exemplary embodiments.
Figure 5B:
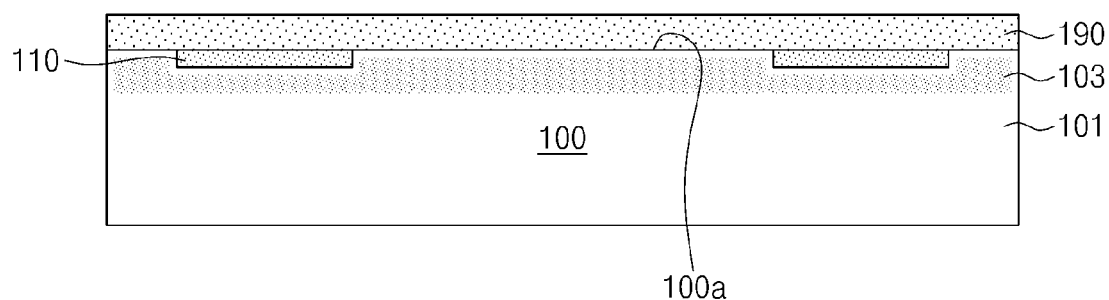
Figure 5C:
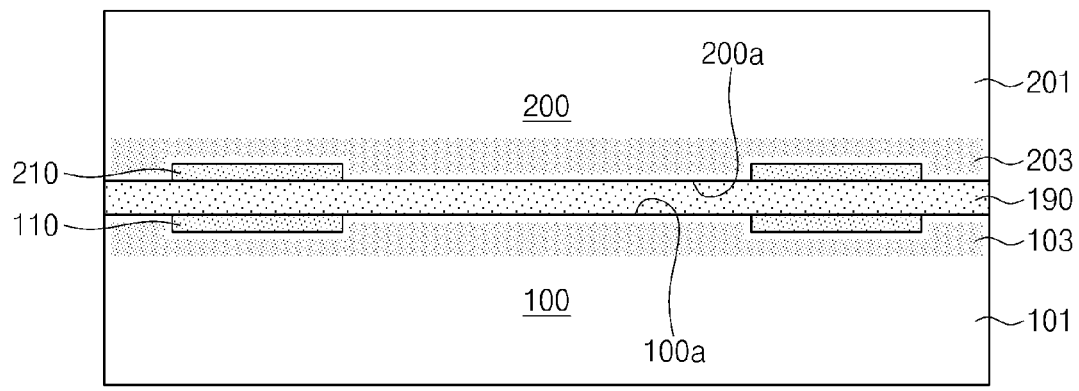
Figure 5D:
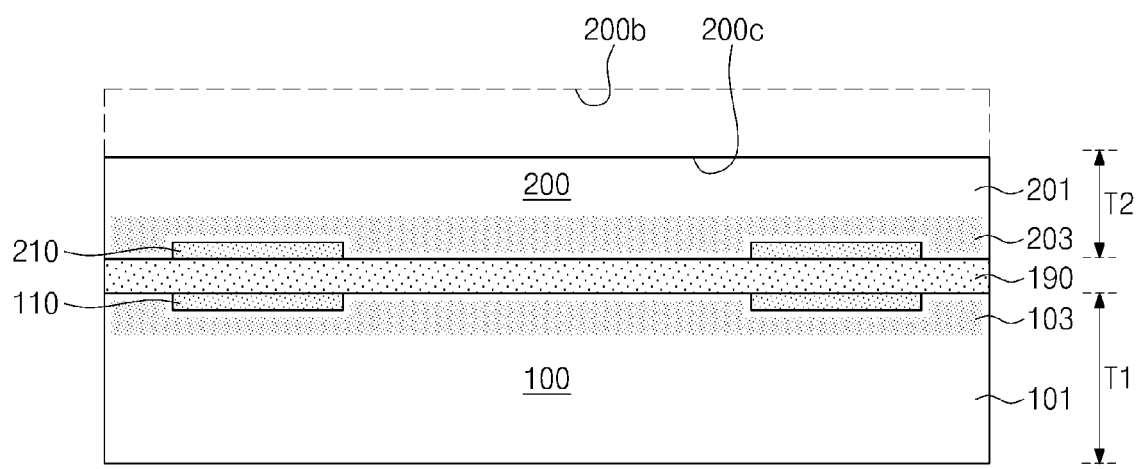
Figure 5E:
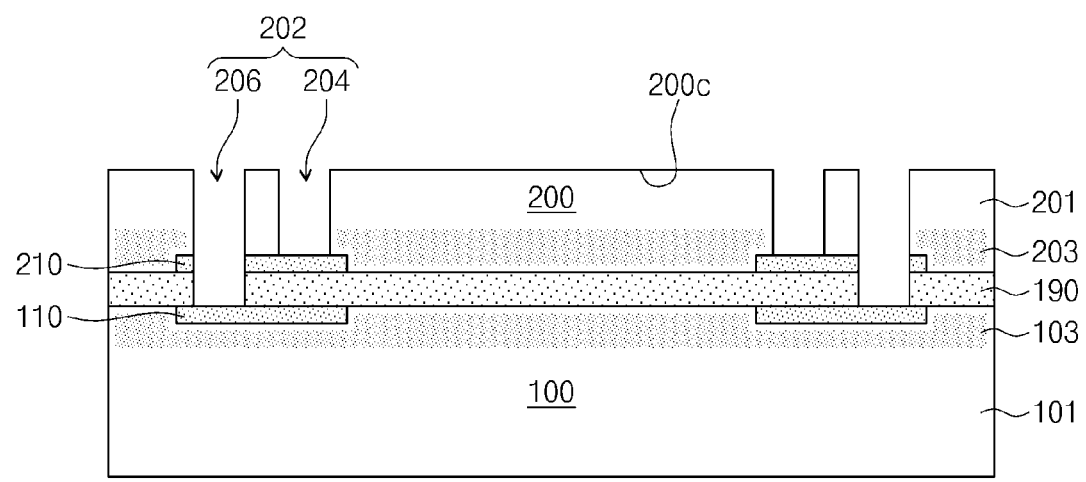
Figure 5F:
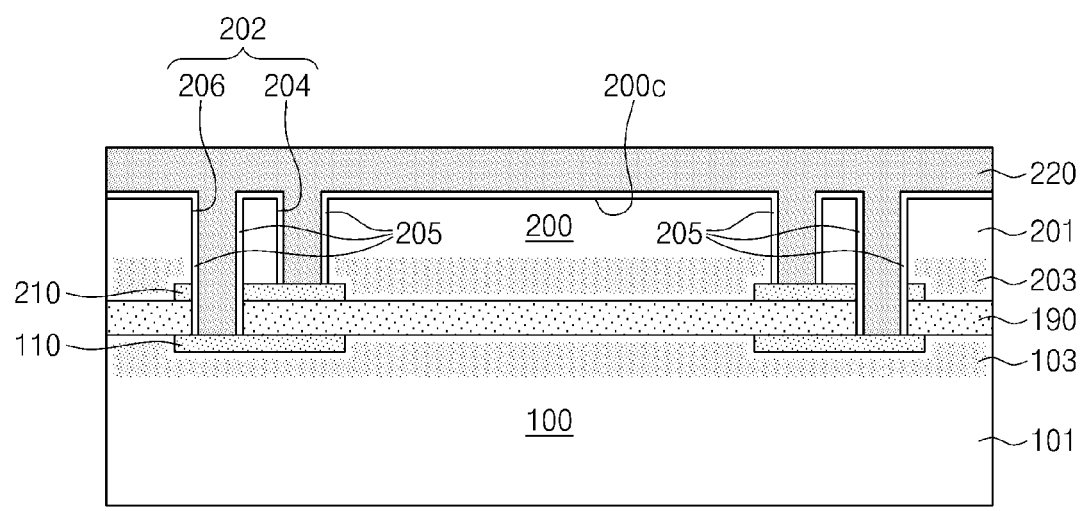
Figure 5G:
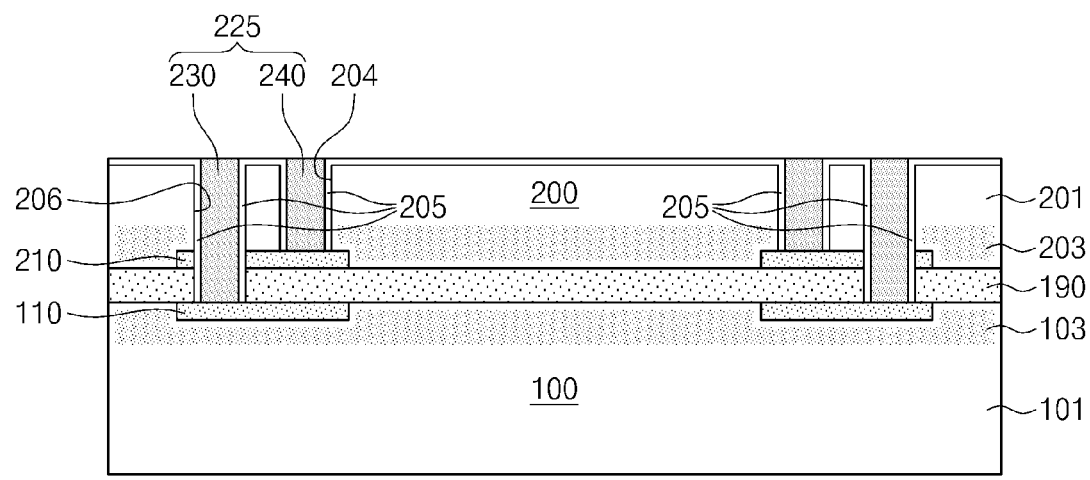
Figure 5H:
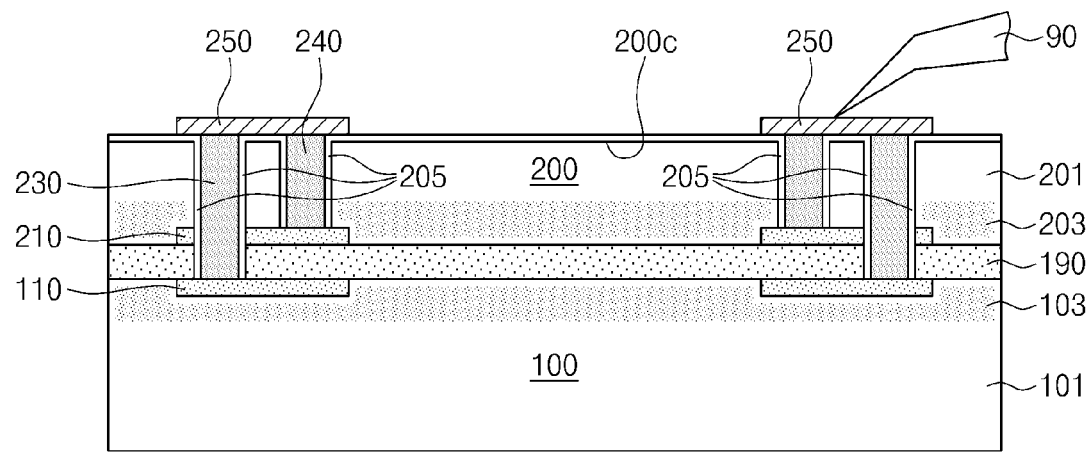
Figure 5I:
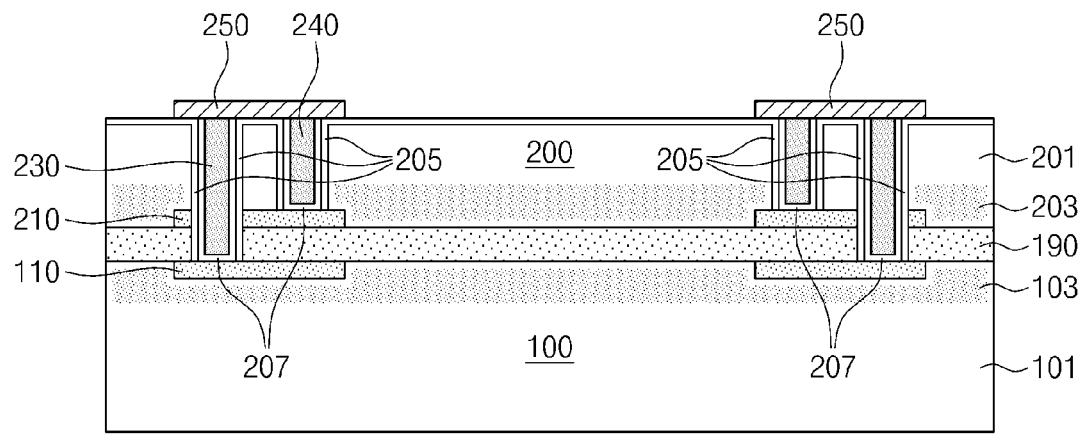
Figure 5J:
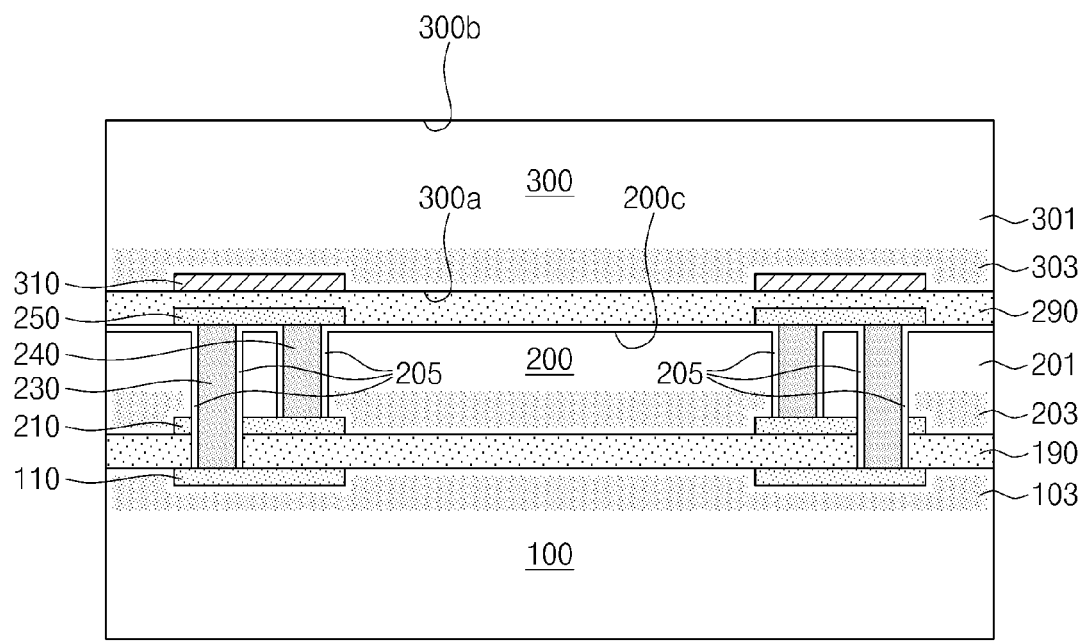
Figure 5K:
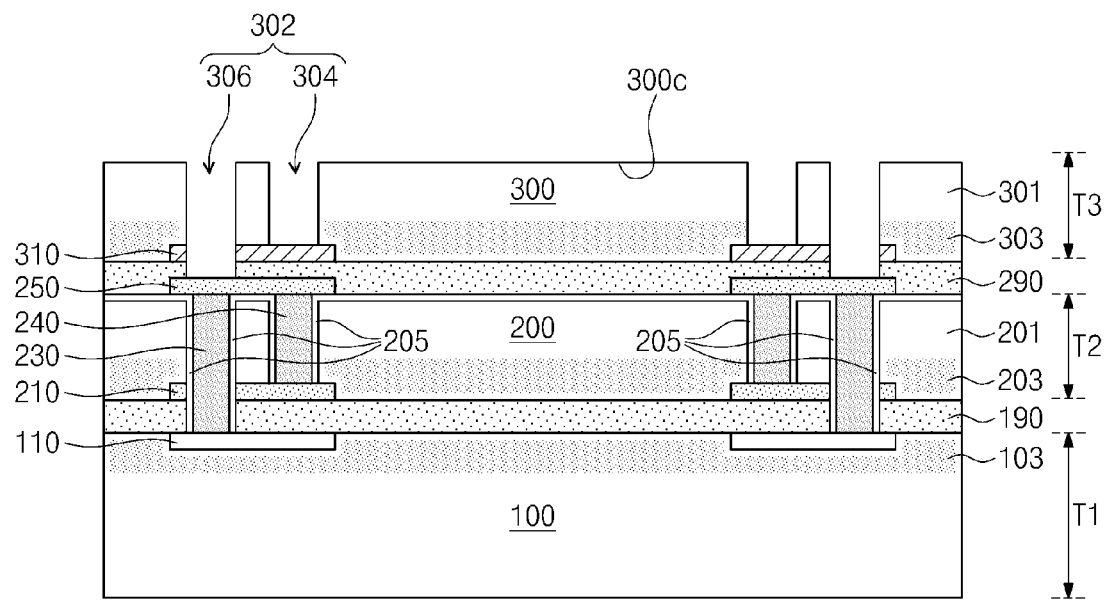
Figure 5L:
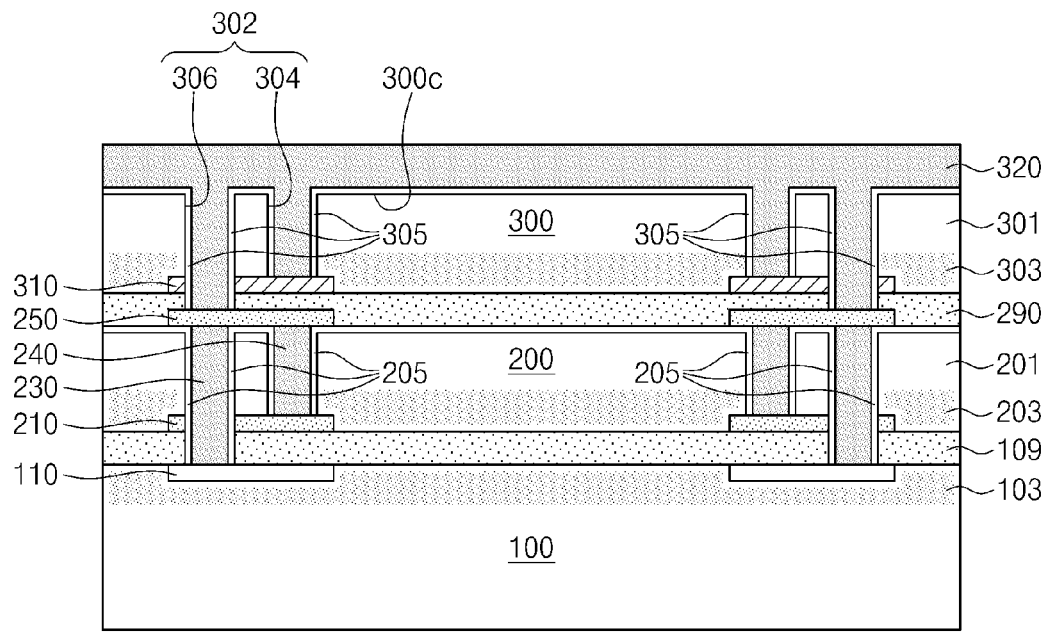
Figure 5M:
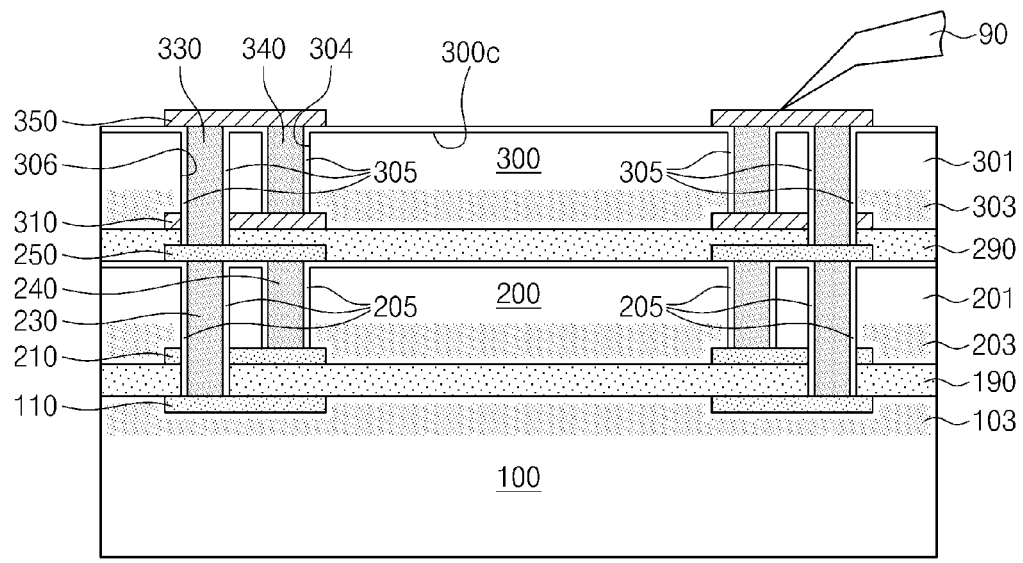
Figure 5N:
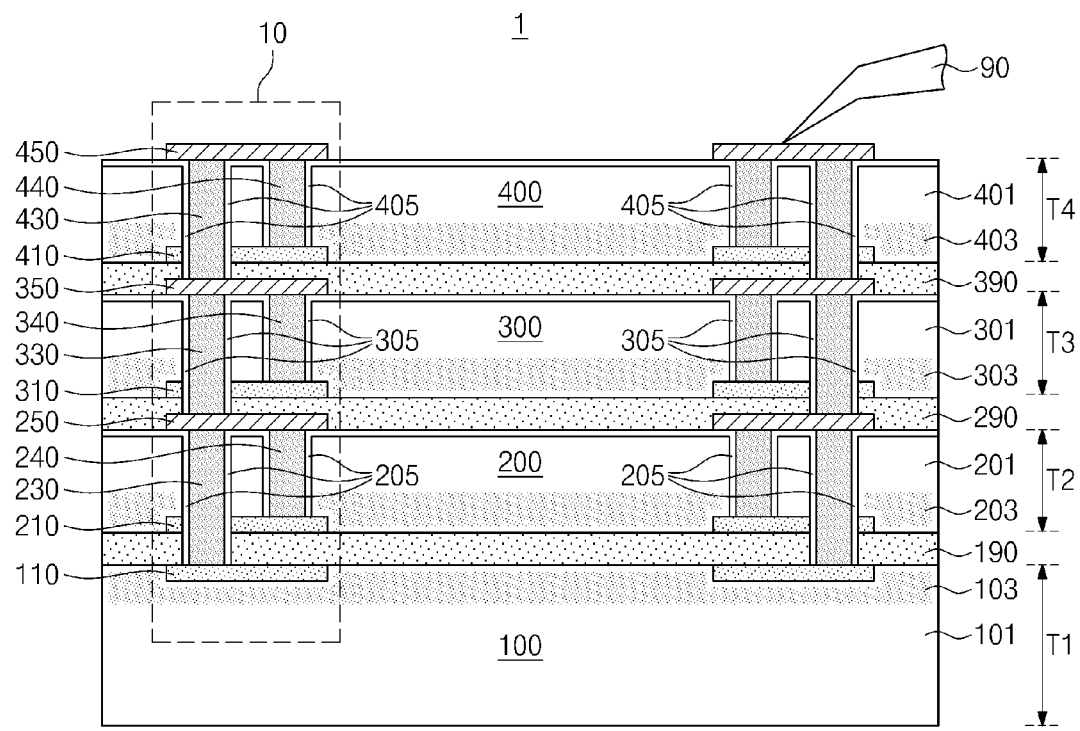

FIGS. 5A to 5N are cross sectional views illustrating a method for fabricating a semiconductor device according to some exemplary embodiments.

Referring to FIG. 5A, a first semiconductor chip 100 may be provided. The first semiconductor chip 100 may include a first substrate 101 having a first integrated circuit 103 and a first top pad 110 which is electrically connected to the first integrated circuit 103. For example, the first substrate 101 may include a semiconductor substrate such as a chip-level or wafer-level silicon wafer. The first integrated circuit 103 may be a memory circuit, a logic circuit, or a combination thereof. However, the type of integrated circuit is not particularly limited. The first top pad 110 may have an L shape illustrated in FIG. 1B, a circular shape, or an elliptical shape, or similar. Selectively, the first top pad 110 may be electrically connected to a probe 90 so as to test the electrical failure of the first semiconductor chip 100.

Referring to FIG. 5B, a first adhesive layer 190 may be formed on the first semiconductor chip 100. The first adhesive layer 190 may be an insulation layer such as a silicon oxide layer, a silicon nitride layer, silicon oxynitride layer, or a polymer layer. For example, the first adhesive layer 190 may be formed by depositing the silicon oxide layer on an active surface 100a of the first semiconductor chip 100. Selectively, the deposited silicon oxide layer may be planarized using a chemical mechanical polishing process to form the first adhesive layer 190. Additionally, a plasma treatment may be further performed before or after the planarization.

Referring to FIG. 5C, a second semiconductor chip 200 may be provided on the first semiconductor chip 100 using a flip-chip bonding method. For example, the second semiconductor chip 200 may be turned upside down such that an active surface 200a of the second semiconductor chip 200 may face the active surface 100a of the first semiconductor chip 100. The first semiconductor chip 100 and the second semiconductor chip 200 may be bonded each other to constitute a face-to-face bonding structure.

The second semiconductor chip 200 may include a second substrate 201 having a second integrated circuit 203 and a second top pad 210 which is electrically connected to the second integrated circuit 203. In some exemplary embodiments, the second substrate 201 may include a semiconductor substrate such as a chip-level or wafer-level silicon wafer. The second integrated circuit 203 may be a memory circuit, a logic circuit, or a combination thereof. However, the type of integrated circuit is not particularly limited. The second top pad 210 may have an L shape as illustrated in FIG. 1B. However, as described above, the L shape is only illustrative and other shapes are contemplated.

Referring to FIG. 5D, the second semiconductor chip 200 may be thinned. For example, a first backside surface 200b of the second semiconductor chip 200 may be subjected to a chemical mechanical process, an etching process, a grinding process, or any combination thereof to reveal a second backside surface 200c. Therefore, the second semiconductor chip 200 may have a second thickness T2 less than a first thickness T1 of the first semiconductor chip 100. The second thickness T2 may be about 50 µm to about 70 µm. In some exemplary embodiments, the first semiconductor chip 100 may have an initial thickness that corresponds to the thickness of a typical carrier (e.g. about 750 µm) such that the first semiconductor chip 100 may act as a carrier such that the use of a separate carrier may be eliminated when performing the thinning process. The second backside surface may be also referred to as an inactive surface.

Referring to FIG. 5E, a via-hole 202 may be formed to penetrate the second semiconductor chip 200. The via-hole 202 may be formed by dry-etching or laser-drilling the inactive surface 200c of the second semiconductor chip 200. The via-hole 202 may include a short via-hole 204 which penetrates the second substrate 201 to expose the second top pad 210 and a long via-hole 206 which penetrates the second substrate 201 and further penetrates the first adhesive layer 190 to expose the first top pad 110. The second top pad 210 may have the L shape as illustrated in FIG. 1B such that the long via-hole 206 may pass through the second top pad 210 without contacting and exposing the second top pad 210. Since the via-hole 202 is formed after the second substrate 201 is thinned, an etching or drilling depth for the via-hole 202 may be reduced and process time and/or burden may be alleviated.

Referring to FIG. 5F, a conductive layer 220 may be formed on the second semiconductor chip 200. For example, a conductor (e.g., Cu, Al, Si) may be plated or deposited on the inactive surface 200c of the second semiconductor chip 200 to form the conductive layer 220 which fills the via-hole 202 and covers the inactive surface 200c. Before forming the conductive layer 220, a second insulating layer 205 may be formed to electrically insulate the conductive layer 220 from the second substrate 201. The second insulating layer 205 may be formed by depositing a silicon oxide layer using a chemical vapor deposition. The second insulating layer 205 may cover an inner surface of the via-hole 202 and the inactive surface 200c except the first top pad 110 and the second top pad 210. For example, the second insulating layer 205 may be formed and then a portion on the first top pad 110 and a portion on the second top pad 210 may be removed by a known process.

Referring to FIG. 5G, the conductive layer 220 may be changed into a through-electrode 225. For example, the through-electrode 225 may be formed by grinding or etching the conductive layer 220 using a chemical mechanical polishing process or an etch-back process until the second via insulating layer 205 is exposed. The through-electrode 225 may include a second long through-electrode 230 which fills the long via-hole 206 to be connected to the first top pad 110 and a second short through-electrode 240 which fills the short via-hole 204 to be connected to the second top pad 210. The second long through-electrode 230 may pass through the second top pad 210 without contacting therewith, as illustrated in FIG. 1B.

Referring to FIG. 5H, a second bottom pad 250 may be formed on the inactive surface 220c of the second semiconductor chip 200. The second bottom pad 250 may be commonly connected to the second long through-electrode 230 and the second short through-electrode 240. The second via insulating layer 205 may electrically insulate the second bottom pad 250 from the second substrate 201. Consequently, the formation of a separate lower insulating layer on the inactive surface 200c of the second semiconductor chip 200 may be eliminated.

The second bottom pad 250 may have a flipped L shape taken by flipping the first top pad 210 along the X-axis as illustrated in FIG. 1C or FIG. 2B, flipping the first top pad 210 along the Y-axis as illustrated in FIG. 3B, or doubly flipping the first top pad 210 along the X-axis and the Y-axis as illustrated in FIG. 4B. The configurations of the second long through-electrode 230 and the second short through-electrode 240 may be identical or similar to one of configurations as illustrated in FIGS. 1C, 2B, 3B and 4B. Selectively, the probe 90 may electrically contact with the second bottom pad 250 to test the electrical failure between the first semiconductor chip 100 and the second semiconductor chip 200. Since the second long through-electrode 230 electrically connects the first semiconductor chip 100 to the second semiconductor chip 200, the formation of solder balls or solder bumps between the first semiconductor chip 100 and the second semiconductor chip 200 may be eliminated or the number thereof reduced.

Alternatively, as illustrated in FIG. 5I, a second intermediate layer 207 may be further formed between the second via insulating layer 205 and the second long through-electrode 230 and between the second via insulating layer 205 and the second short through-electrode 240. For example, when the second long through-electrode 230 and the second short through-electrode 240 are formed of copper, the second intermediate layer 207 may be formed to prevent copper from being diffused. As illustrated in FIG. 5F, after forming the second via insulating layer 205, the second intermediate layer 207 may be formed by plating or depositing metal including Ti or Ta. Alternatively, the second intermediate layer 207 may be formed to have a barrier layer and an adhesive layer stacked one atop the other. For example, the second intermediate layer 207 may include a barrier layer (e.g., Ta) capable of preventing copper from being diffused and an adhesive layer (e.g., Mg) capable of bonding each of the second through-electrode 230 and the second short through-electrode 240 to the barrier layer.

According to some exemplary embodiments, more than one semiconductor chip may be further stacked on the second semiconductor chip 200 using processes identical or similar to those as illustrate in FIGS. 5A to 5I. This is explained with reference to FIGS. 5J to 5N below.

Referring to FIG. 5J, a silicon oxide layer may be deposited and polished to form a second adhesive layer 290 on the inactive surface 200c of the second semiconductor chip 200, and then a third semiconductor chip 300 may be provided on the second semiconductor chip 200 using a flip-chip bonding method. For example, the third semiconductor chip 300 may be faced down such that an active surface 300a of the third semiconductor chip 300 may face the inactive surface 200c of the second semiconductor chip 200. The second semiconductor chip 200 and the third semiconductor chip 300 may be bonded each other to constitute a back-to-face bonding structure.

The third semiconductor chip 300 may have a structure identical or similar to that of the second semiconductor chip 200. For example, the third semiconductor chip 300 may include a third substrate 301 having a third integrated circuit 303 and a third top pad 310 which is electrically connected to the third integrated circuit 303. The third substrate 301 may include a semiconductor substrate such as a chip-level or wafer-level silicon wafer including an active surface 300a and a first backside surface 300b. The third integrated circuit 303 may be a memory circuit, a logic circuit, or a combination thereof. However, the type of integrated circuit is not particularly limited. The third top pad 310 may have an L shape as illustrated in FIG. 1B. For example, the third top pad 310 may have the L shape taken by flipping the second bottom pad 250 along the X-axis, or horizontally rotating the second bottom pad 250 at an angle of 90°.

Referring to FIG. 5K, the third semiconductor chip 300 may be thinned by grinding or etching the first backside surface 300b of the third semiconductor chip 300 until inactive surface 300c is revealed. Therefore, the third semiconductor chip 300 may have a third thickness T3 less than the first thickness T1 of the first semiconductor chip 100. The third thickness T3 may be identical or similar to the second thickness T2 of the second semiconductor chip 200. A via-hole 302 may be formed to penetrate the third semiconductor chip 300 using a dry etching process or a laser drilling process. The via-hole 302 may include a short via-hole 304 which penetrates the third substrate 301 to expose the third top pad 310 and a long via-hole 306 which penetrates the third substrate 301 and further penetrates the second adhesive layer 290 to expose the second bottom pad 250. Since the second bottom pad 250 has the L shape as illustrated in FIG. 1B, the long via-hole 306 may pass through the second bottom pad 250 without contacting therewith.

Referring to FIG. 5L, a conductor (e.g., Cu, Al, Si) may be plated or deposited on the inactive surface 300c of the third semiconductor chip 300 to form a conductive layer 320 which fills the via-hole 302 and covers the inactive surface 300c. Before forming the conductive layer 320, a silicon oxide layer may be deposited to form a third via insulating layer 305 which electrically insulates the conductive layer 320 from the third substrate 301. The third via insulating layer 305 may cover an inner surface of the via-hole 302 and the inactive surface 300c except the third top pad 310 and the second bottom pad 250. For example, the third insulating layer 305 may be formed and then a portion on the third top pad 310 and a portion on the second bottom pad 250 may be removed by a known process.

Referring to FIG. 5M, the conductive layer 320 may be grinded or etched by a chemical mechanical polishing process or an etch-back process until the third via insulating layer 305 is revealed, which may form a third long through-electrode 330 and a third short through-electrode 340. A third bottom pad 350 may be formed on the inactive surface 300c of the third semiconductor chip 300. The third bottom pad 350 may be commonly connected to the third long through-electrode 330 and the third short through-electrode 340.

The third long through-electrode 330 may fill the long via-hole 306 to be connected to the third top pad 310, and the third short through-electrode 340 may fill the short via-hole 304 to be connected to the second bottom pad 250. The third long through-electrode 330 may pass through the third top pad 310 without contacting therewith, as illustrated in FIG. 1B. The third bottom pad 350 may have a flipped L shape taken by flipping the third top pad 310 along the X-axis identical or similar to the configurations as illustrated in FIG. 1C or FIG. 2B, flipping the third top pad 310 along the Y-axis identical or similar to the configurations as illustrated in FIG. 3B, or doubly flipping the third top pad 310 along the X-axis and the Y-axis identical or similar to the configurations as illustrated in FIG. 4B. The third long through-electrode 330 may be vertically aligned with the second long through-electrode 230, and the third short through-electrode 340 may be vertically aligned with the second short through-electrode 240. Selectively, the probe 90 may electrically contact with the third bottom pad 350 to test the electrical failure between the first to third semiconductor chips 100, 200 and 300.

Referring to FIG. 5N, a fourth semiconductor chip 400 may be further stacked on the third semiconductor chip 300. The stacking of the fourth semiconductor chip 400 may be accomplished using processes identical or similar to the processes used to stack the third semiconductor chip 300. The third semiconductor chip 300 and the fourth semiconductor chip 400 may be bonded each other to constitute a back-to-face bonding structure. Selectively, the probe 90 may contact with the fourth semiconductor chip 400 to test the electrical failure between the first to fourth semiconductor chips 100, 200, 300 and 400.

The fourth semiconductor chip 400 may have a structure identical or similar to that of the second semiconductor chip 200 or the third semiconductor chip 300. For example, the fourth semiconductor chip 400 may include a fourth substrate 401 having a fourth integrated circuit 403, a fourth top pad 410 which is electrically connected to the fourth integrated circuit 403, a fourth long through-electrode 430 which penetrates the fourth substrate 401 to be connected to the third bottom pad 350, a fourth short through-electrode 440 which penetrates the fourth substrate 401 and a third adhesive layer 390 to be connected to the fourth top pad 410, a fourth bottom pad 450 which is commonly connected to the fourth long through-electrode 430 and the fourth short through-electrode 440, and a fourth via insulating layer 405 which electrically insulates each of the fourth long through-electrode 430 and the fourth short through-electrode 440 from the fourth substrate 401. The probe 90 may contact with the fourth bottom pad 450 to test electrical failure.

The fourth semiconductor chip 400 may be thinned to have a fourth thickness T4 less than the first thickness T1 of the first semiconductor chip 100. The fourth thickness T4 may be identical or similar to the second thickness T2 and/or the third thickness T3. The fourth substrate 401 may include a semiconductor substrate such as a chip-level or wafer-level silicon wafer. The fourth integrated circuit 403 may be a memory circuit, a logic circuit, or a combination thereof. However, the type of integrated circuit is not particularly limited. The fourth bottom pad 450 may have a flipped L shape taken by flipping the fourth top pad 410 along the X-axis identical, or similar to the configurations as illustrated in FIG. 1C or FIG. 2B, flipping the fourth top pad 410 along the Y-axis identical, or similar to the configurations as illustrated in FIG. 3B, or doubly flipping the first top pad 410 along the X-axis and Y-axis identical, or similar to the configurations as illustrated in FIG. 4B. However, as with the other pads discussed above, the shape of the pads may be varied, and are not particularly limited to the L shape. The fourth long through-electrode 430 may be vertically aligned with the third long through-electrode 330, and the fourth short through-electrode 440 may be vertically aligned with the third short through-electrode 340.

According to the processes described above, a semiconductor device 1 may be fabricated to include the second to fourth semiconductor chips 200, 300 and 400 that are flip-chip bonded onto the first semiconductor chip 100. If the semiconductor device 1 is a wafer-level device, a sawing process may be further performed to divide the semiconductor device 1 into a plurality of chip-level devices. The semiconductor device 1 may include the conductive interconnection 10 which is configured to vertically transmit electrical signals as illustrated in FIG. 1B. Alternatively, the semiconductor device 1 may include the conductive interconnection 10a of FIG. 2A, the conductive interconnection 10b of FIG. 3A, or the conductive interconnection 10c of FIG. 4A.

Figure 6A:
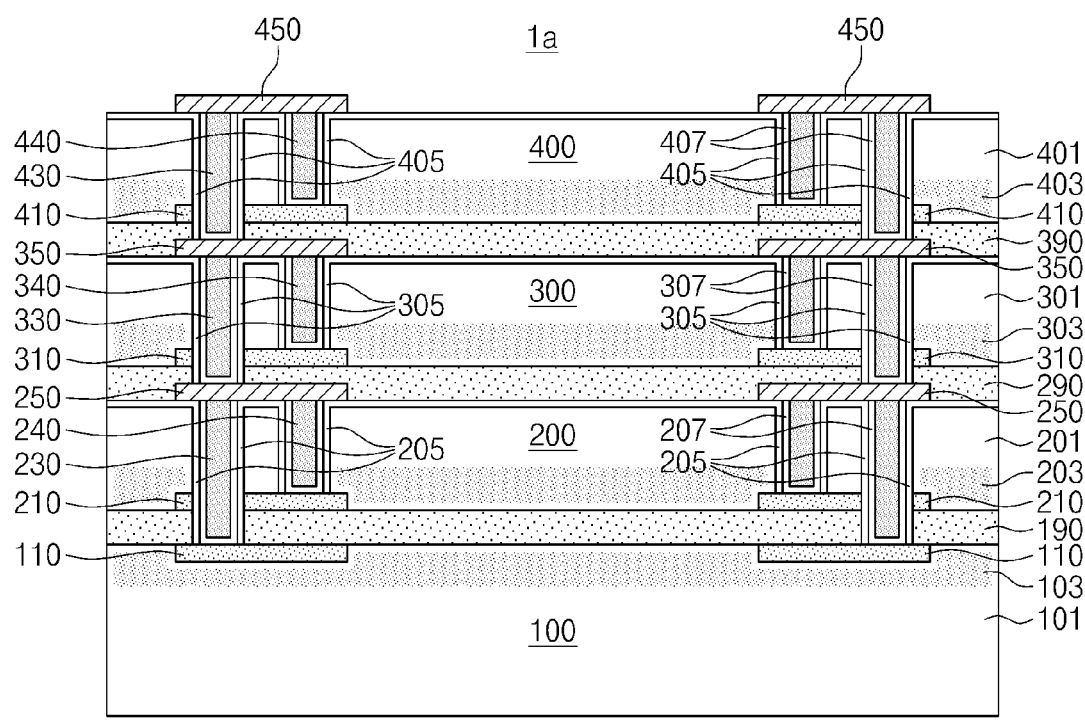
FIG. 6A illustrates a cross sectional view of another exemplary embodiment of the semiconductor device shown in FIG. 5N in which the process of FIG. 5I is applied in the processes of FIGS. 5L and 5N.
Figure 6B:
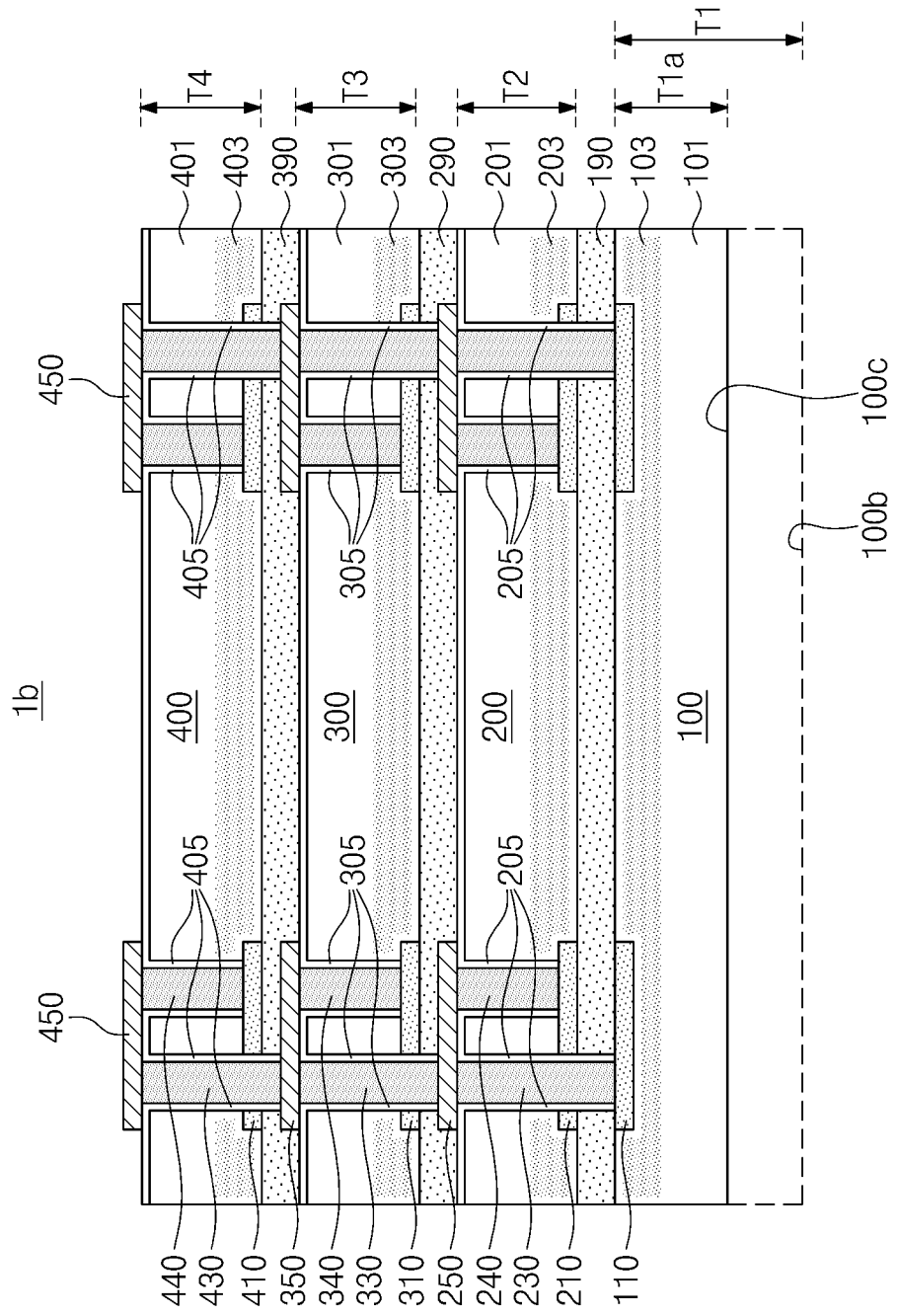
FIG. 6B is a cross sectional view of another exemplary embodiment of the semiconductor device shown in FIG. 5N.

FIG. 6A illustrates a cross sectional view of another exemplary embodiment of the semiconductor device shown in FIG. 5N in which the process of FIG. 5I is applied in the processes of FIGS. 5L and 5N. FIG. 6B is a cross sectional view of another exemplary embodiment of the semiconductor device shown in FIG. 5N.

Referring to FIG. 6A, a semiconductor device 1a may be fabricated to further include second to fourth intermediate layers 207, 307 and 407 by performing processes identical or similar to the process as illustrated in FIG. 5I. At least one of the second to fourth intermediate layers 207, 307 and 407 may include a barrier layer or barrier/adhesive layers.

Referring to FIG. 6B, a semiconductor device 1c may be fabricated to include a thinned semiconductor chip 100. For example, a first backside surface 100b of the first semiconductor chip 100 may be applied to a chemical mechanical polishing process, an etching process, a grinding process, or any combination thereof to uncover an inactive surface 100c. Consequently, the first semiconductor chip 100 may have a reduced first thickness T1a less than the initial first thickness T1. The reduced first thickness T1a may be identical or similar to one of the second to fourth thicknesses T2, T3 and T4. Since the second to fourth semiconductor chips 200, 300 and 400 may act as a carrier, the use of a separate carrier when performing the thinning process may be eliminated. Alternatively, the thinning process of the first semiconductor chip 100 may be performed in a case in which the carrier is bonded to the fourth semiconductor chip 400. It will be understood that the thinning process of FIG. 6B does not depend on the intermediate layers of FIG. 6A. Rather, the thinning process of FIG. 6B may be applied to the semiconductor devices of any of the above-described exemplary embodiments.

Figure 6C:
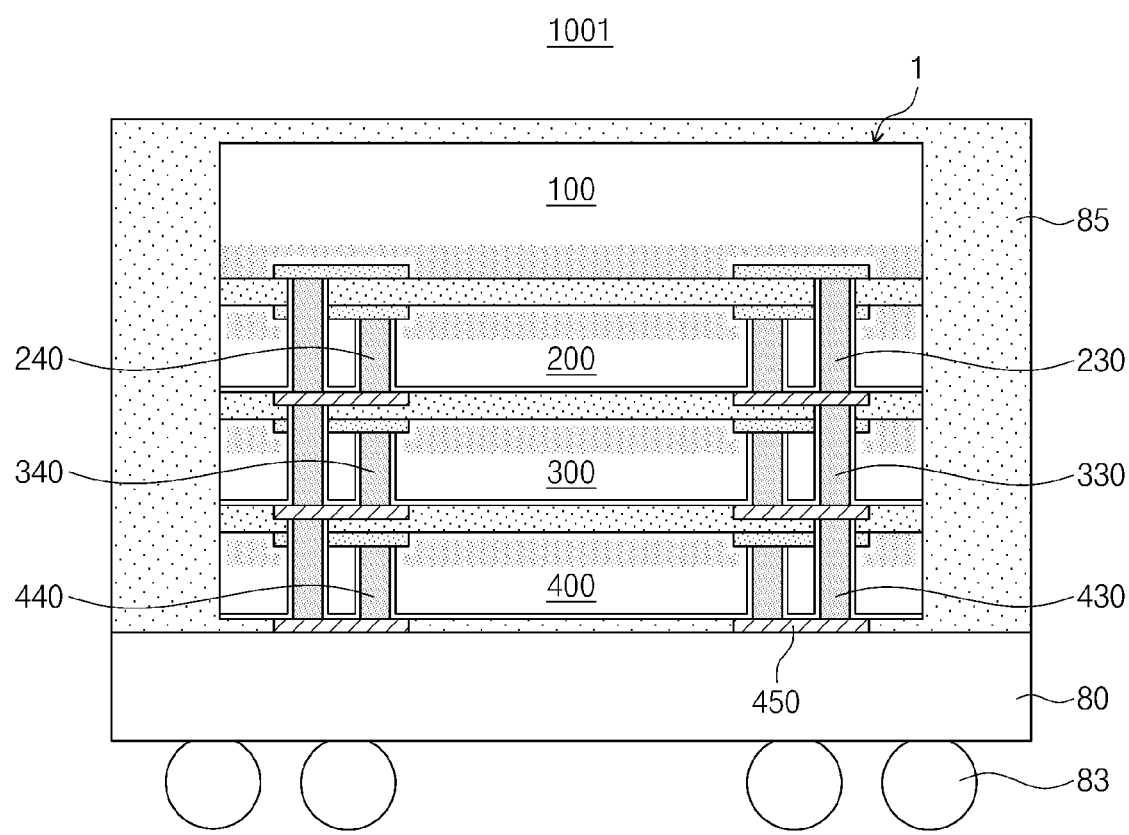
FIG. 6C is a cross sectional view illustrating a semiconductor package in which the semiconductor device of FIG. 5N is packaged.

FIG. 6C is a cross sectional view illustrating a semiconductor package in which the semiconductor device of FIG. 5N is packaged.

Referring to FIG. 6C, the semiconductor device 1 of FIG. 5N may be mounted on a package substrate 80 and a molding layer 85 may be formed to encase the semiconductor device 1, thereby fabricating a semiconductor package 1001. A plurality of external terminals 83 such as solder balls may be further attached onto the package substrate 80. The semiconductor device 1 according to any of the above-described exemplary embodiments may be turned upside down and then mounted on the package substrate 80. Therefore, the fourth bottom pad 450 of the fourth semiconductor chip 400 may contact with the package substrate 80 such that the semiconductor device 1 may be electrically connected to the package substrate 80. It will be understood that the packaging process of FIG. 6C does not depend on the thinning process of FIG. 6B or the intermediate layers of FIG. 6A. Rather, the packaging process of FIG. 6C may be applied to the semiconductor devices of any of the above-described exemplary embodiments.

Figure 7A:
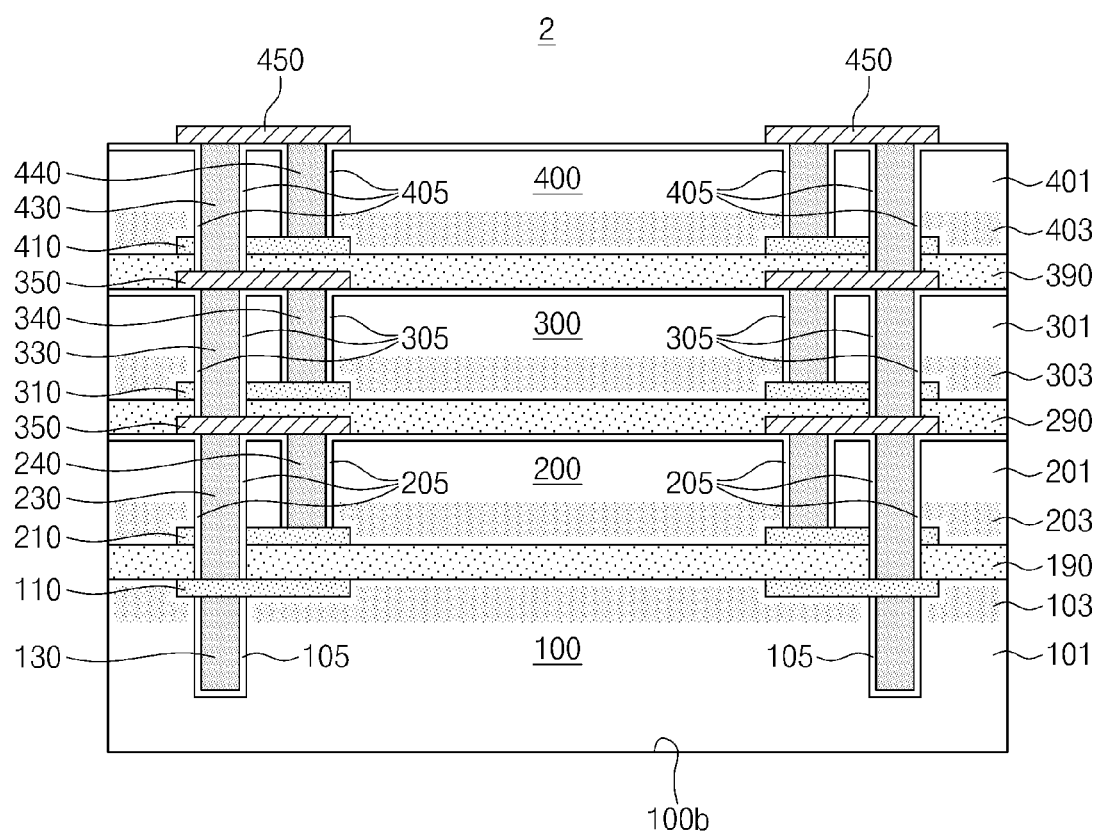
FIGS. 7A to 7C are cross sectional views illustrating a method for fabricating a semiconductor device according to other exemplary embodiments.
Figure 7B:
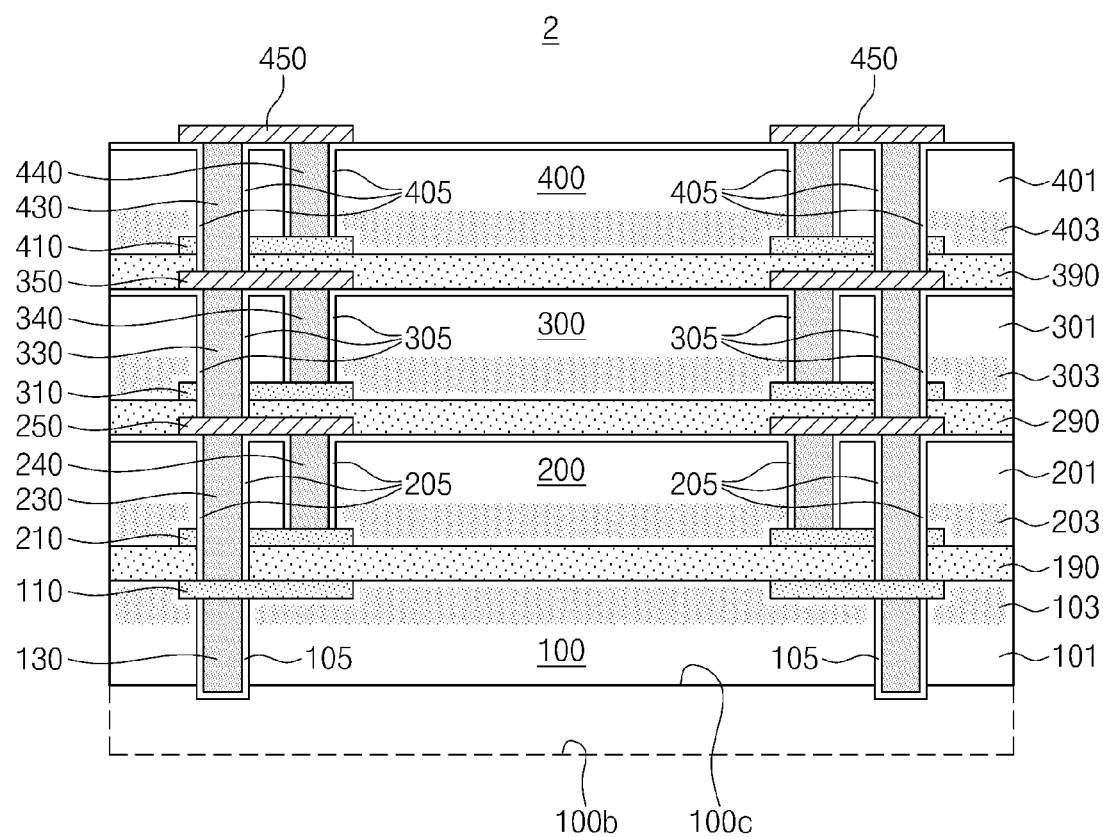
Figure 7C:
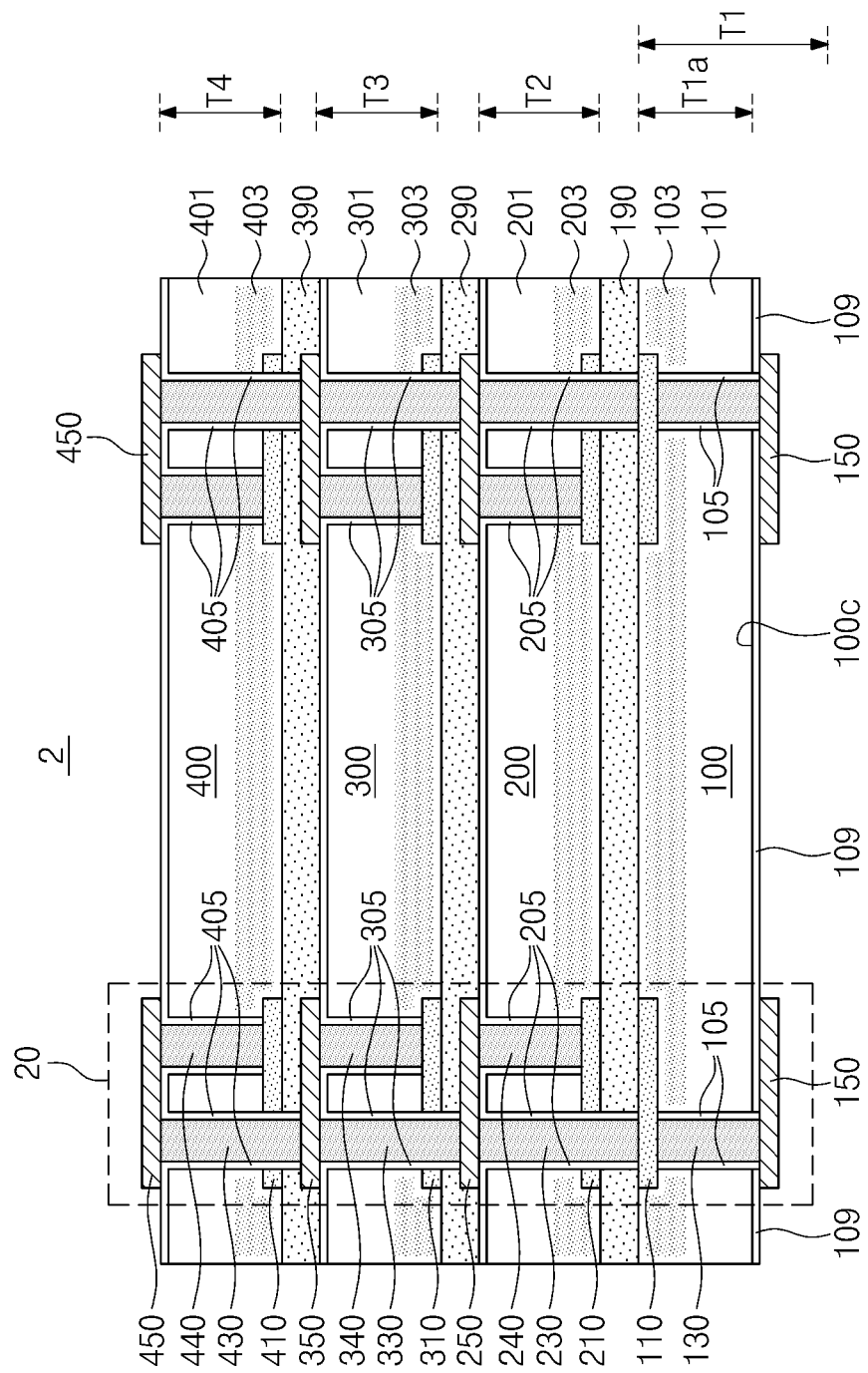
Figure 7D:
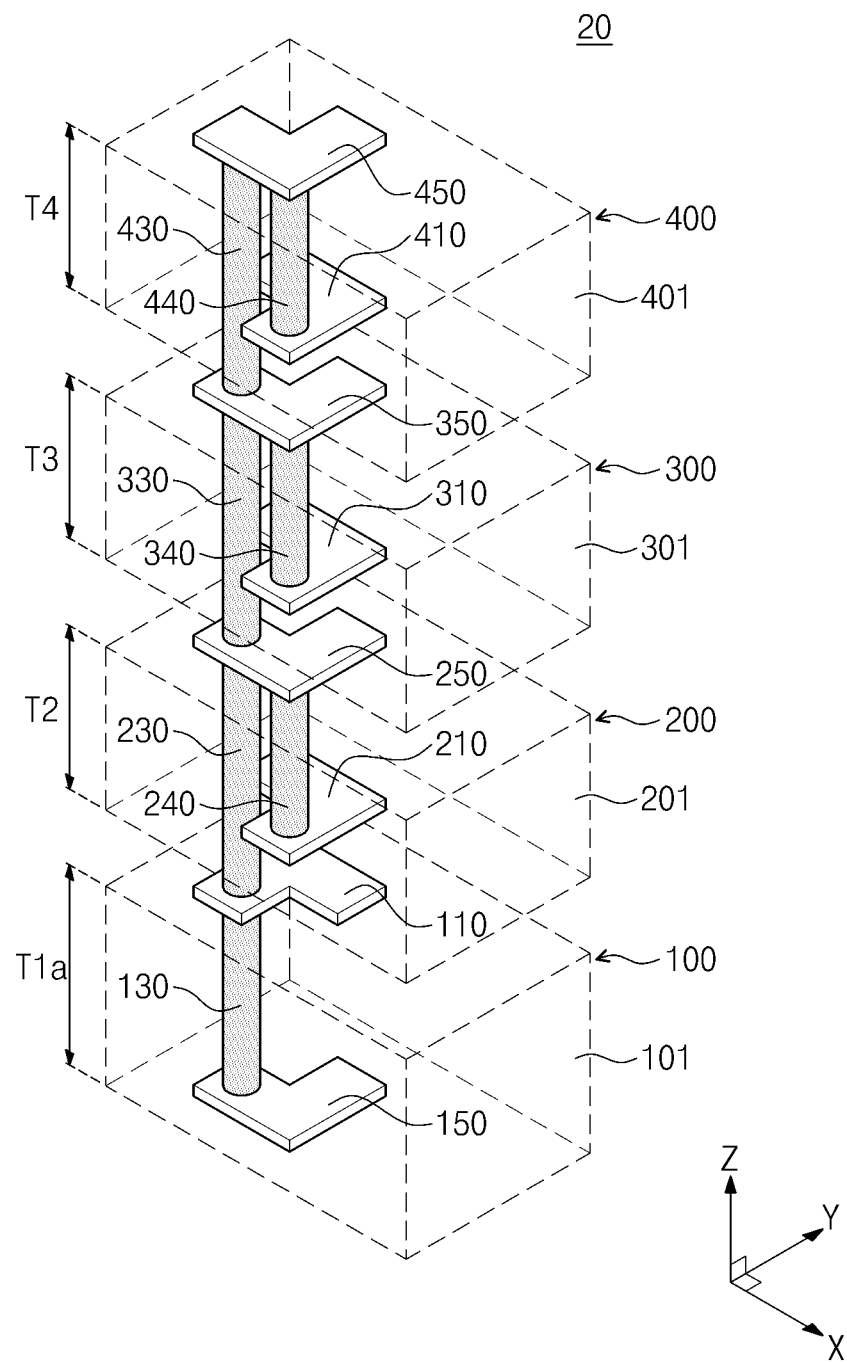
FIG. 7D is an enlarged perspective view illustrating a portion of FIG. 7C.

FIGS. 7A to 7C are cross sectional views illustrating a method for fabricating a semiconductor device according to some exemplary embodiments. FIG. 7D is an enlarged perspective view illustrating a portion of FIG. 7C.

Referring to FIG. 7A, in a semiconductor device 2, the second to fourth semiconductor chips 200, 300 and 400 may be flip-chip bonded onto the first semiconductor chip 100 using processes identical or similar to those illustrated with reference to FIGS. 5A to 5N. However, in the exemplary embodiment shown in FIG. 7A, the first semiconductor chip 100 may further include a first through-electrode 130 connected to the first top pad 110 and a first via insulating layer 105 which electrically insulates the first through-electrode 130 from the first substrate 101. The first through-electrode 130 may partially penetrate the first substrate 101 such that the first through-electrode 103 does not reach the first backside surface 100b. Alternatively, the first through-electrode 103 may extend through to the first backside surface 100b. As one example, the first through-electrode 130 may be vertically aligned with the second long through-electrode 230.

Referring to FIG. 7B, the first semiconductor chip 100 may be thinned to expose the first through-electrode 130. For example, a chemical mechanical polish process, a grinding process, an etch-back process, or any combination thereof may be applied to the first backside surface 100b of the first substrate 101 to reveal an inactive surface 100c. The first through-electrode 130 may protrude from the inactive surface 100c. The thinning process may be performed without a carrier. Alternatively, the thinning process may be performed in a case in which a carrier is attached to the fourth semiconductor chip 400.

Referring to FIG. 7C, a first bottom pad 150 may be formed on the inactive surface 100c of the first semiconductor chip 100. The first bottom pad 150 may be connected to the first through-electrode 130. Before forming the first bottom pad 150, a silicon oxide layer may be deposited and grinded to form a lower insulating layer 109 which covers the inactive surface 100c except the first through-electrode 130.

According to the processes described above, the semiconductor device 2 may be fabricated to include a conductive interconnection 20 as illustrated in FIG. 7D with the second to fourth semiconductor chips 200, 300 and 400 that are flip-chip bonded onto the first semiconductor chip 100 which has the reduced first thickness T1a less than the initial first thickness T1. One of the first top pad 110 and the first bottom pad 150 may have an L shape taken by doubly flipping the other of the first top pad 110 and the first bottom 150 along the X-axis and the Y-axis, or horizontally rotating the other at an angle of 180° identical, or similar to the configurations as illustrated in FIG. 4B. However, the shape of the first top pad 110 and the first bottom pad 150 are not particularly limited, and alternatively, for example, the first top pad 110 and the first bottom pad 150 may have a circular shape, an elliptical shape, or a polygonal shape, or may have different shapes.

Figure 7E:
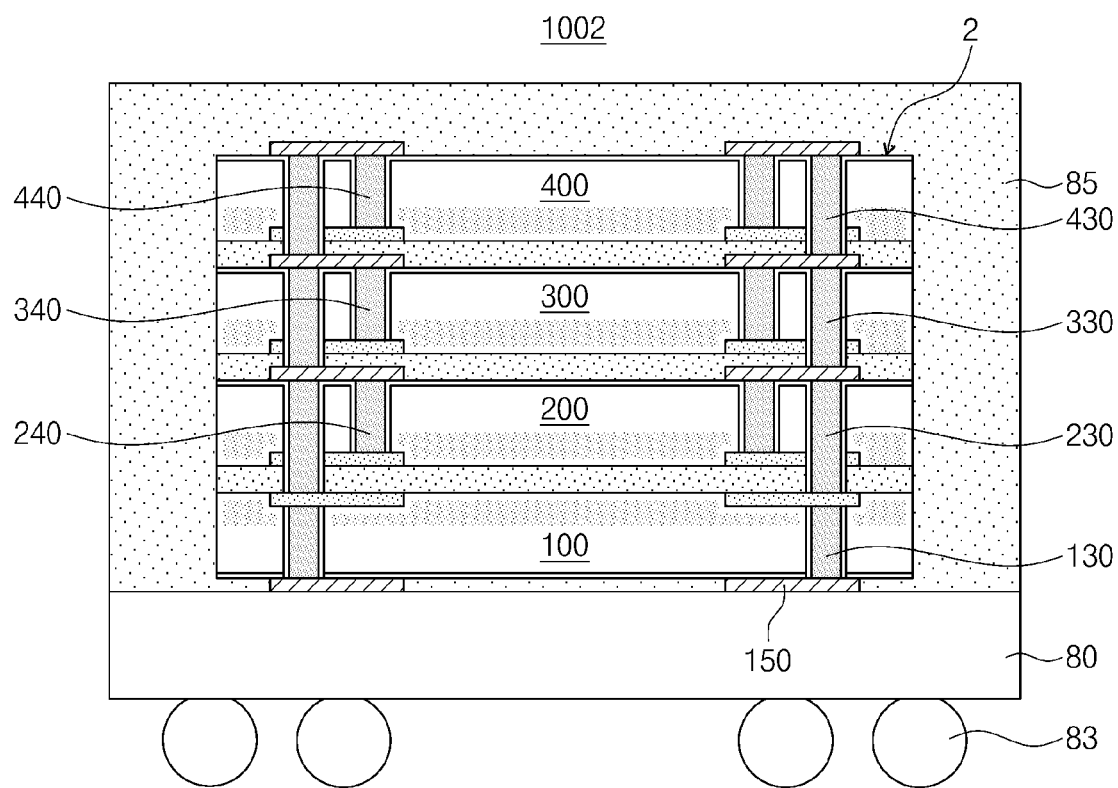
FIG. 7E is a cross sectional view illustrating a semiconductor package in which the semiconductor device of FIG. 7C is packaged.

FIG. 7E is a cross sectional view illustrating a semiconductor package in which the semiconductor device of FIG. 7C is packaged.

Referring to FIG. 7E, the semiconductor device 2 of FIG. 7C may be mounted on the package substrate 80 and the molding layer 85 may be formed to encase the semiconductor device 2, thereby fabricating a semiconductor package 1002. The plurality of external terminals 83 such as solder balls may be further attached onto the package substrate 80. The first bottom pad 150 of the first semiconductor chip 100 may contact with the package substrate 80 such that the semiconductor device 2 may be electrically connected to the package substrate 80.

Figure 8A:
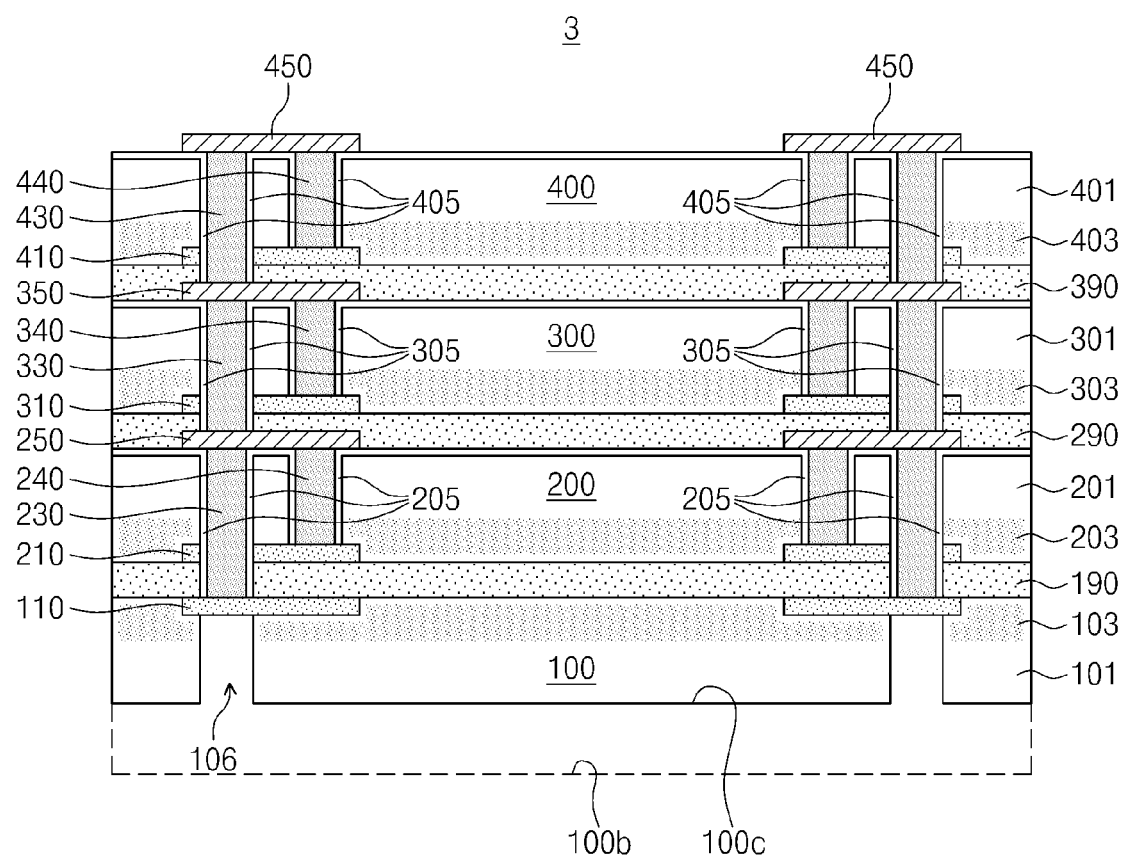
FIGS. 8A to 8C are cross sectional views illustrating a method for fabricating a semiconductor device according to other exemplary embodiments.
Figure 8B:
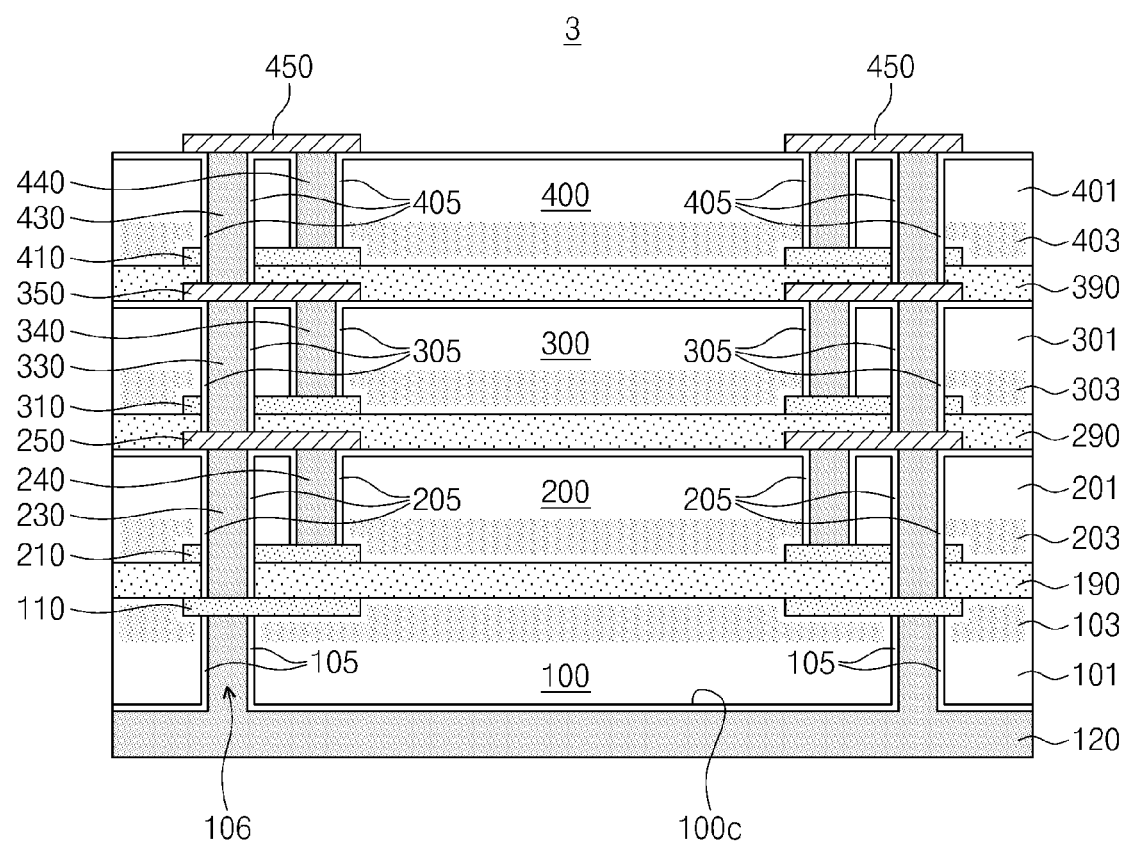
Figure 8C:
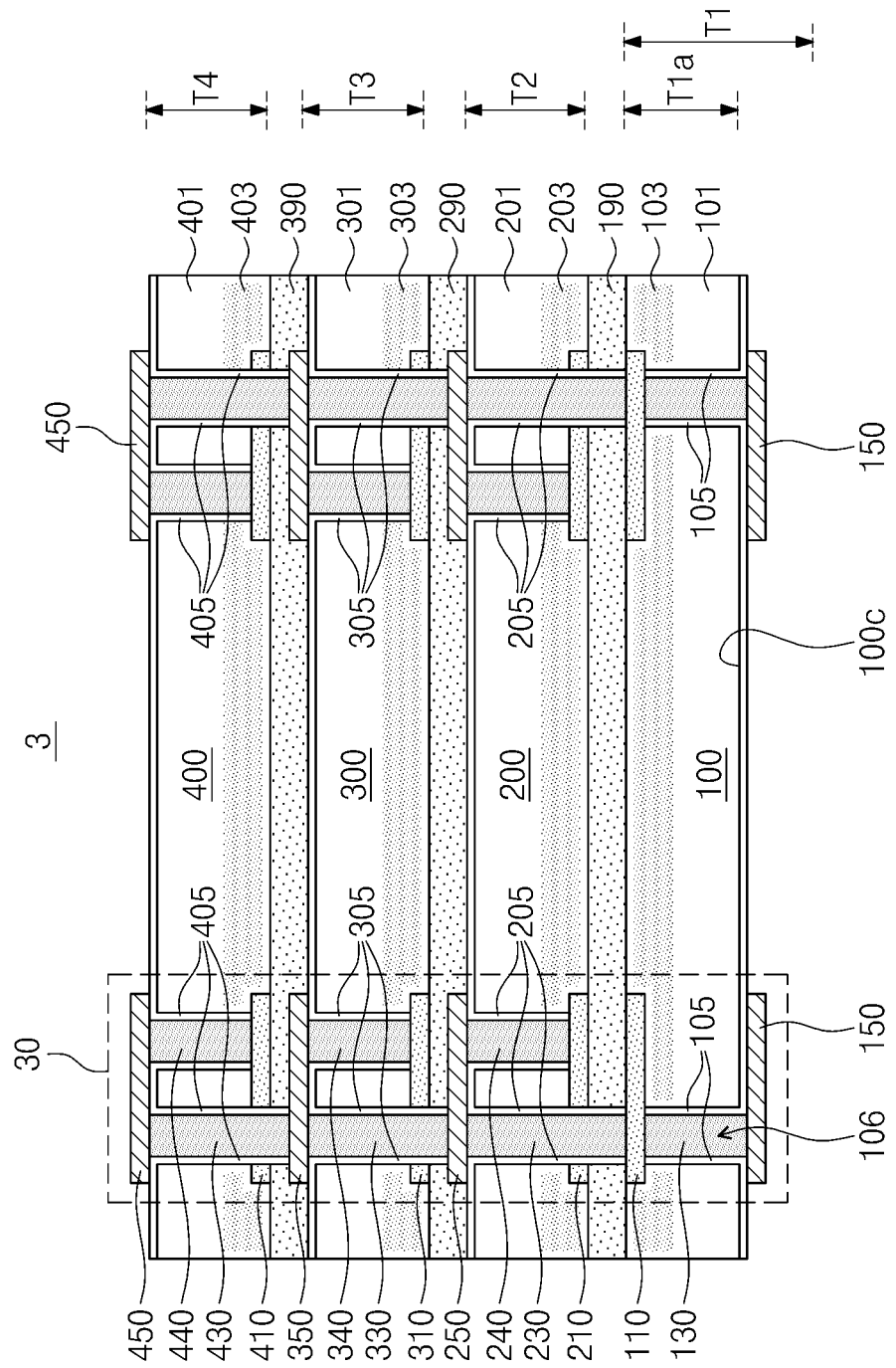

FIGS. 8A to 8C are cross sectional views illustrating a method for fabricating a semiconductor device according to some exemplary embodiments.

Referring to FIG. 8A, in a semiconductor device 3, the second to fourth semiconductor chips 200, 300 and 400 may be flip-chip bonded onto the first semiconductor chip 100 using processes identical or similar to those illustrated with reference to FIGS. 5A to 5N. The first semiconductor chip 100 may be thinned and then a via-hole 106 may be formed. For example, a chemical mechanical polish process, a grinding process, an etch-back process, or any combination thereof may be applied to the first backside surface 100b of the first substrate 101 to reveal the inactive surface 100c. The thinning process may be performed without a carrier. Alternatively, the thinning process may be performed in a case in which a carrier is attached to the fourth semiconductor chip 400.

After thinning the first semiconductor chip 100, the inactive surface 100c may be selectively dry-etched to form the via-hole 106 through which the first top pad 110 is exposed. Since the via-hole 106 is formed after the first substrate 101 is thinned, an etching or drilling depth for the via-hole 106 may be reduced and process time and/or burden may be alleviated.

Referring to FIG. 8B, a conductor (e.g., Cu, Al, Si) may be plated or deposited on the inactive surface 100c of the first semiconductor chip 100 to form a conductive layer 120 which fills the via-hole 106 and covers the inactive surface 100c. Before forming the conductive layer 120, a silicon oxide layer may be deposited to form the first via insulating layer 105 which electrically insulates the conductive layer 120 from the first substrate 101. The first via insulating layer 105 may cover an inner surface of the via-hole 106 and the inactive surface 100c. After forming the conductive layer 120, the conductive layer 120 may be grinded or etched by a chemical mechanical polishing process or an etch-back process until the first via insulating layer 105 is exposed.

Referring to FIG. 8C, the conductive layer 120 may be grinded or etched to form the first through-electrode 130 which fills the via-hole 106. The first through-electrode 130 may penetrate the first substrate 101 to be electrically connected to the first top pad 110. The first bottom pad 150 may be formed on the inactive surface 100c of the first semiconductor chip 100. The first via insulating layer 105 may electrically insulate the first bottom pad 150 from the inactive surface 100c of the first substrate 101. Consequently, by providing the first via insulating layer 105, a separate lower insulating layer which covers the inactive surface 100c of the first semiconductor chip 100 may be eliminated.

According to processes described above with reference to FIGS. 8A to 8C, a semiconductor device 3 may be fabricated to include a conductive interconnection 30 and the second to fourth semiconductor chips 200, 300 and 400 that are flip-chip bonded onto the first semiconductor chip 100 which has the reduced first thickness T1a less than the initial first thickness T1. The conductive interconnection 30 may be identical or similar to the conductive interconnection 20 as illustrated in FIG. 7D.

Figure 8D:
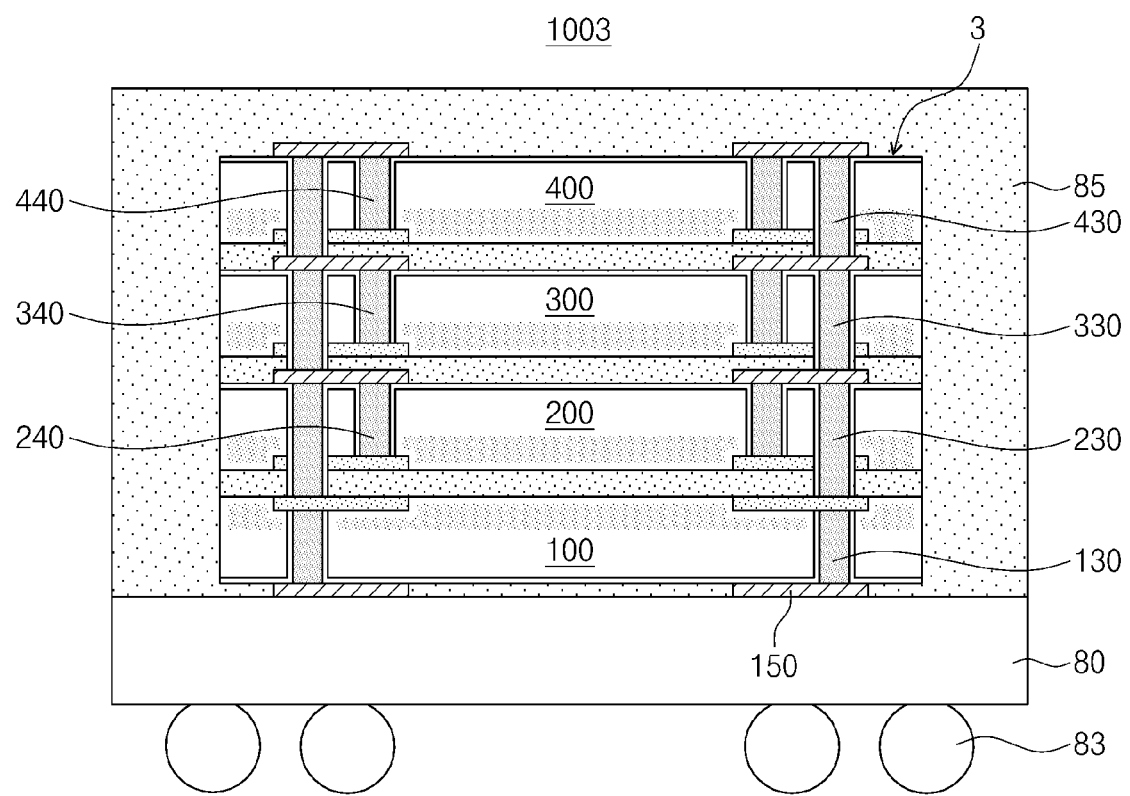
FIG. 8D is a cross sectional view illustrating a semiconductor package in which the semiconductor device of FIG. 8C is packaged.

FIG. 8D is a cross sectional view illustrating a semiconductor package in which the semiconductor device of FIG. 8C is packaged.

Referring to FIG. 8D, the semiconductor device 3 of FIG. 8C may be mounted on the package substrate 80 and the molding layer 85 may be formed to encase the semiconductor device 3, thereby fabricating a semiconductor package 1003. The plurality of external terminals 83 such as solder balls may be further attached onto the package substrate 80. The first bottom pad 150 of the first semiconductor chip 100 may contact with the package substrate 80 such that the semiconductor device 3 may be electrically connected to the package substrate 80.

Figure 9A:
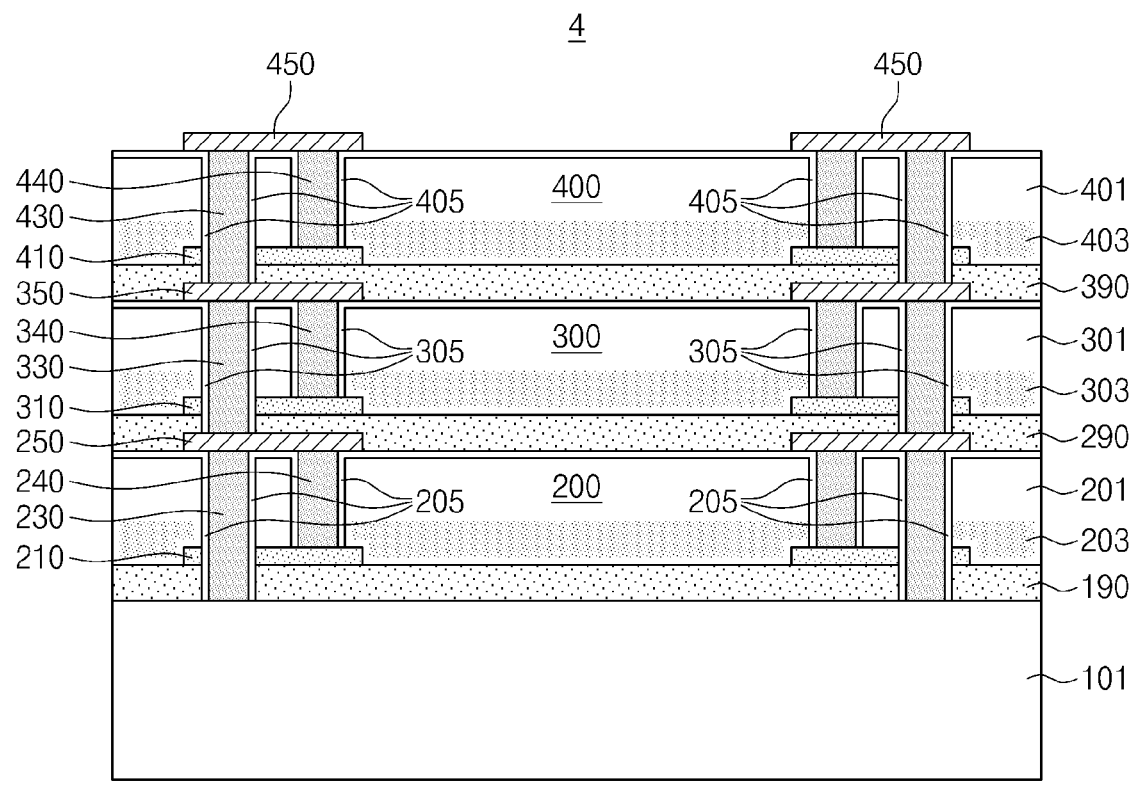
FIGS. 9A and 9B are cross sectional views illustrating a method for fabricating a semiconductor device according to other exemplary embodiments.
Figure 9B:
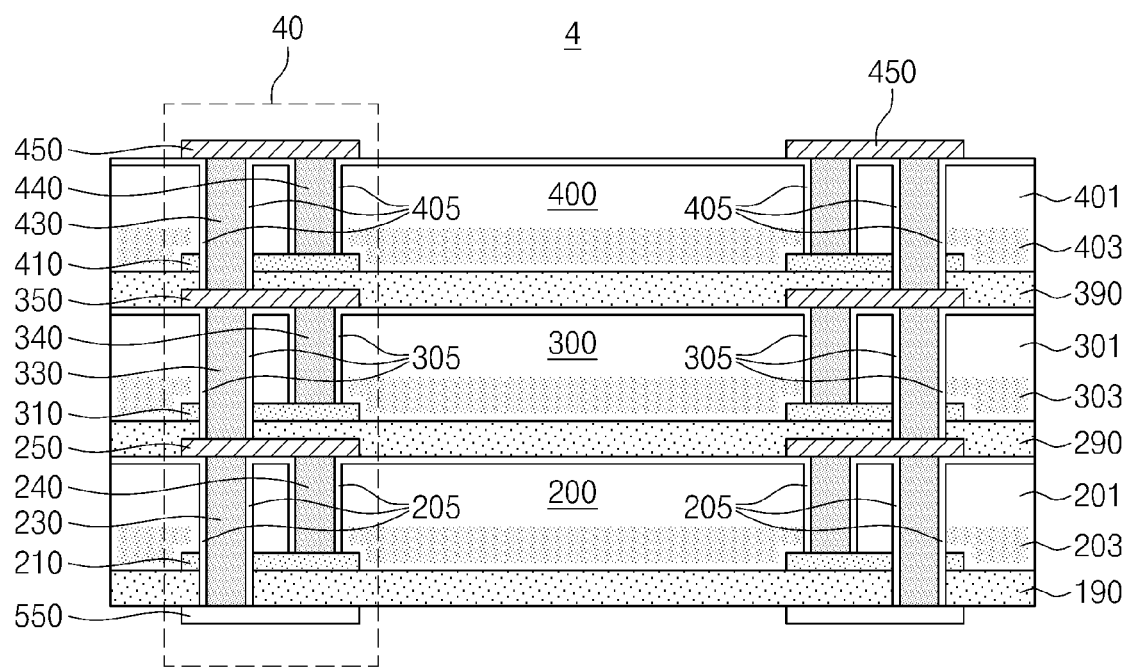
Figure 9C:
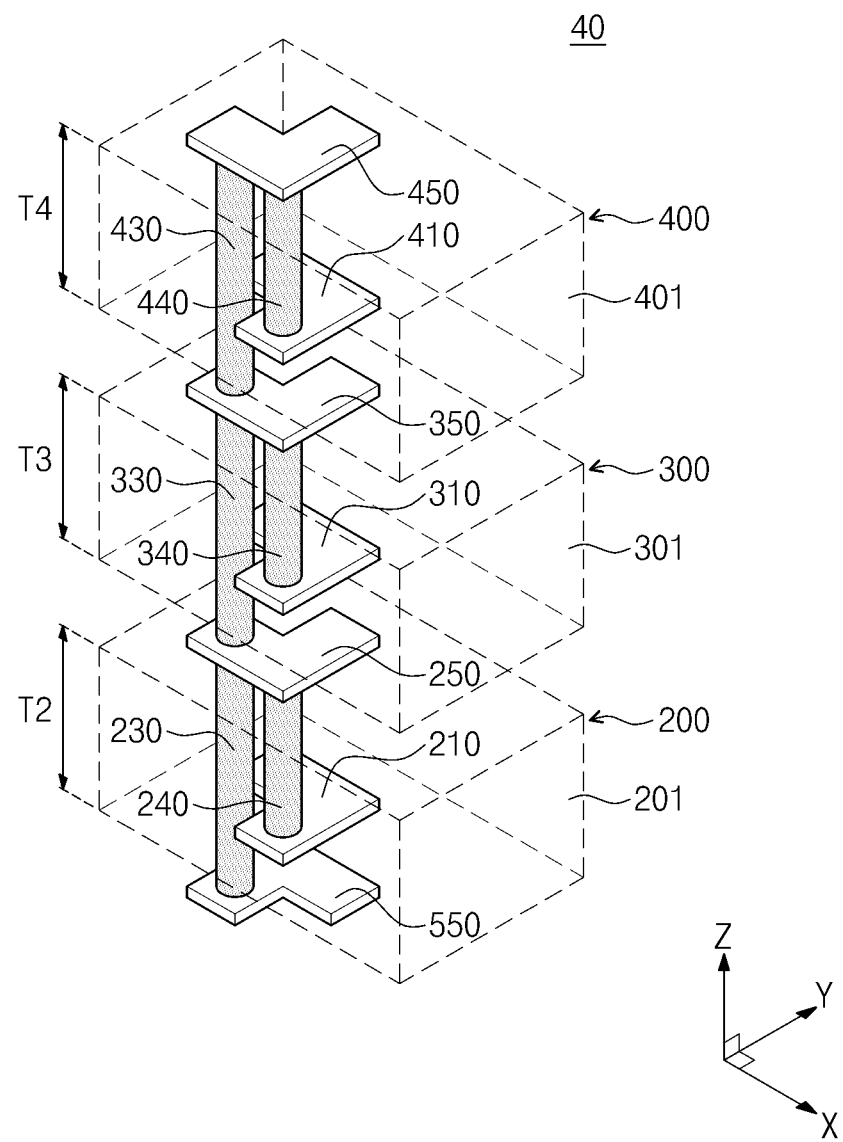
FIG. 9C is an enlarged perspective view illustrating a portion of FIG. 9B.
Figure 9D:
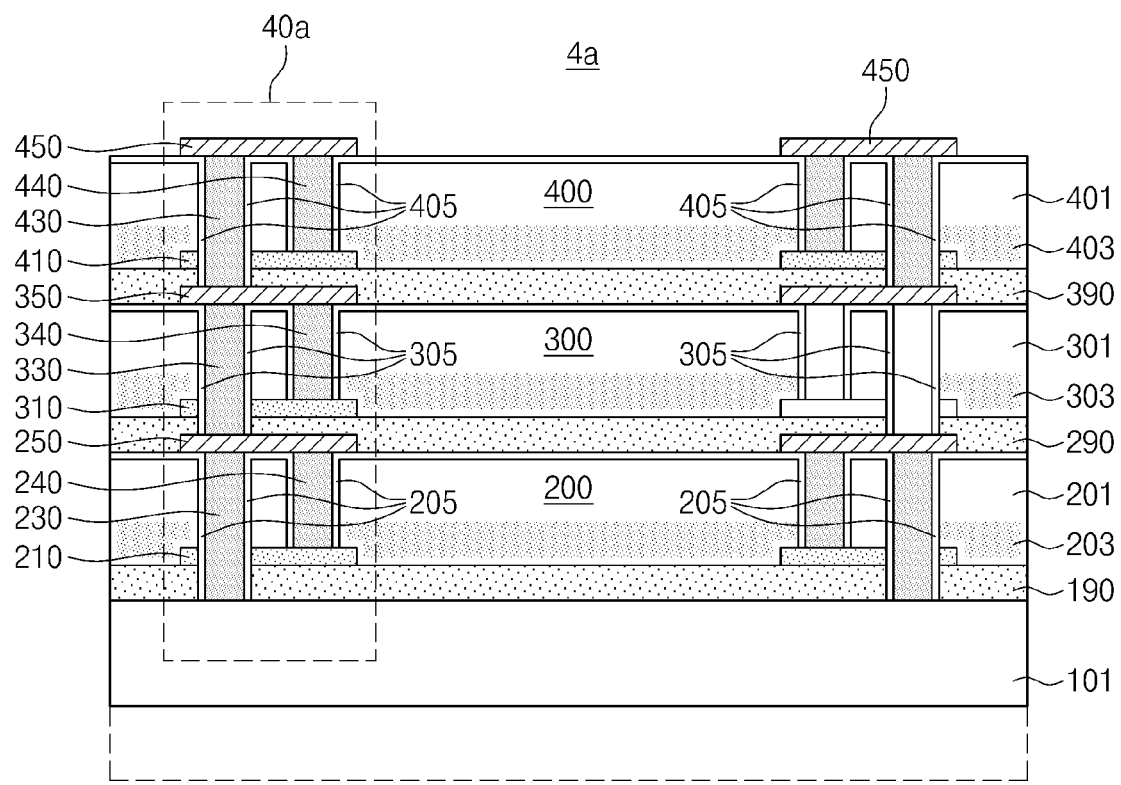
FIG. 9D is a cross sectional view illustrating according to another exemplary embodiment.

FIGS. 9A and 9B are cross sectional views illustrating a method for fabricating a semiconductor device according to some exemplary embodiments. FIG. 9C is an enlarged perspective view illustrating a portion of FIG. 9B. FIG. 9D is a cross sectional view illustrating another exemplary embodiment of FIG. 9B.

Referring to FIG. 9A, in a semiconductor device 4, the second to fourth semiconductor chips 200, 300 and 400 may be flip-chip bonded onto the first substrate 101 using processes identical or similar to those illustrated with reference to FIGS. 5A to 5N. In some exemplary embodiments, the first substrate 101 may be a carrier or a dummy substrate such as a silicon wafer or a glass substrate.

Referring to FIG. 9B, the first substrate 101 may be removed and an external pad 550 may be formed on the first adhesive layer 190. The external pad 550 may be connected to the second long through-electrode 230. The external pad 550 may have an L shape taken by flipping the second top pad 210 having the L shape along the Y-axis, or horizontally rotating the second top pad 210 counterclockwise at an angle of 90°, as illustrated in FIG. 9C. Alternatively, the external pad 550 may have an arbitrary shape such as a circular shape, an elliptical shape or a polygonal shape. According to processes described in FIGS. 9A and 9B, a semiconductor device 4 may be fabricated to include a conductive interconnection 40 of FIG. 9C and the second to fourth semiconductor chips 200, 300 and 400 stacked on one another.

Alternatively, the first substrate 101 may be thinned as illustrated in FIG. 9D. Consequently, a semiconductor device 4a may be fabricated to include the second to fourth semiconductor chips 200, 300 and 400 that are stacked on the thinned first substrate 101. A conductive interconnection 40a may partially penetrate the semiconductor device 4a to electrically connect the second to fourth semiconductor chips 200, 300 and 400 to each other.

Figure 9E:
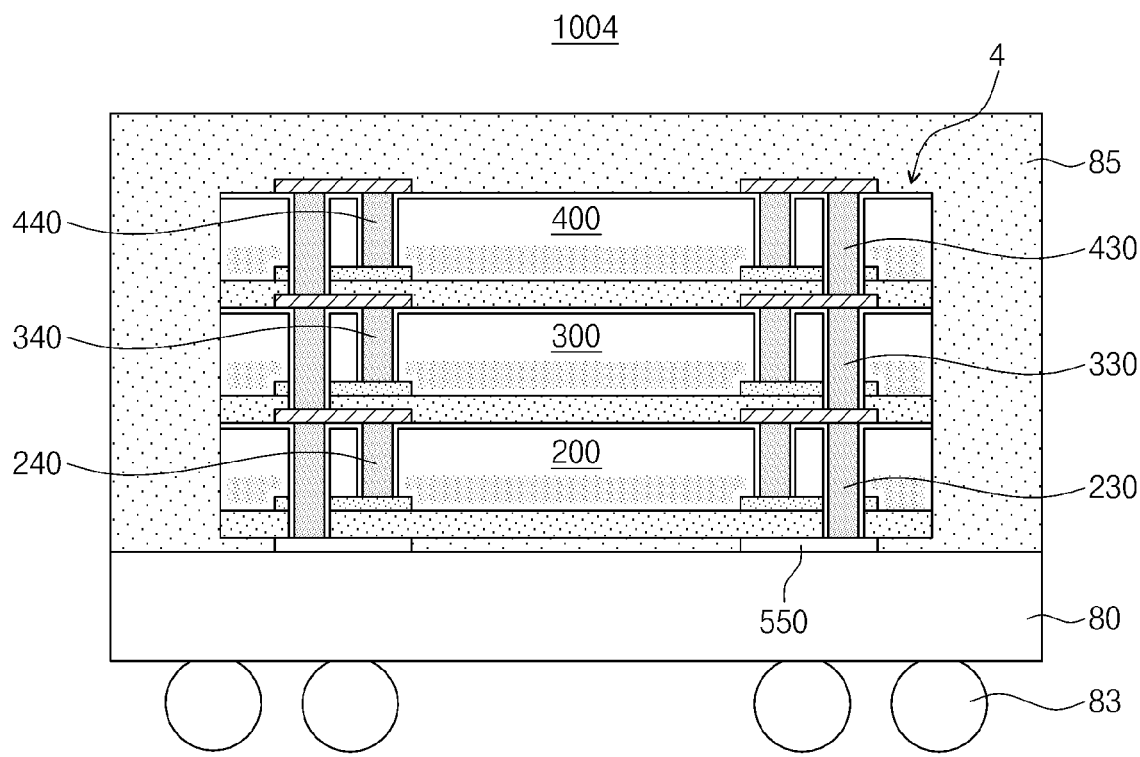
FIG. 9E is a cross sectional view illustrating a semiconductor package in which the semiconductor device of FIG. 9B is packaged.

FIG. 9E is a cross sectional view illustrating a semiconductor package in which the semiconductor device of FIG. 9B is packaged.

Referring to FIG. 9E, the semiconductor device 4 of FIG. 9B may be mounted on the package substrate 80 and the molding layer 85 may be formed to encase the semiconductor device 4, thereby fabricating a semiconductor package 1004. The plurality of external terminals 83 such as solder balls may be further attached onto the package substrate 80. The external pad 550 may contact with the package substrate 80 such that the semiconductor device 4 may be electrically connected to the package substrate 80.

Figure 10A:
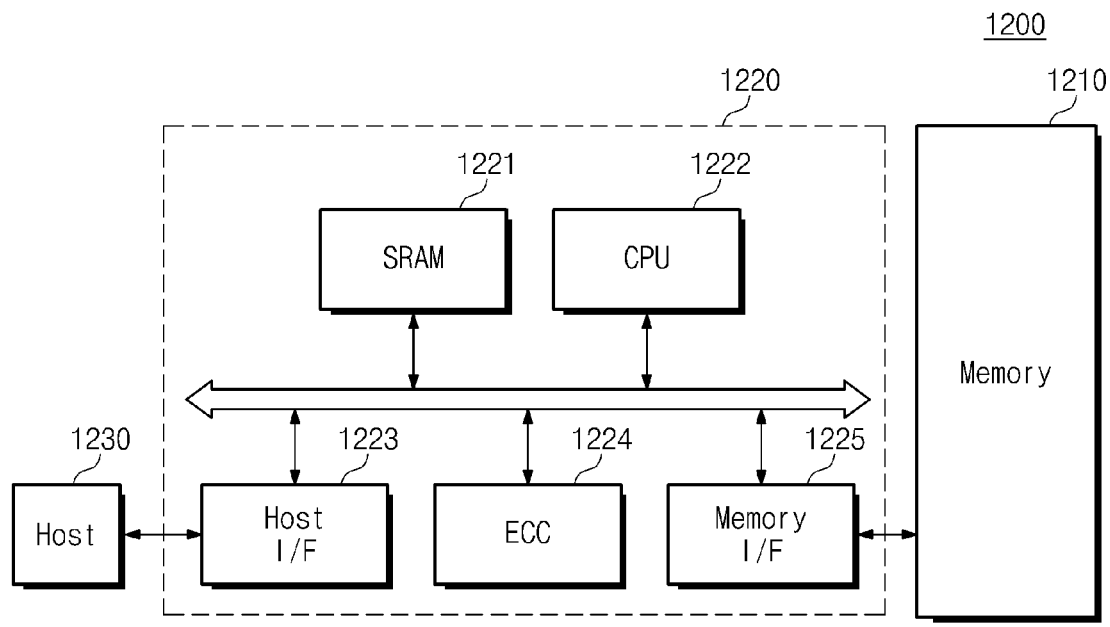
FIG. 10A is a schematic block diagram illustrating an example of memory cards including a semiconductor device according to some exemplary embodiments.
Figure 10B:
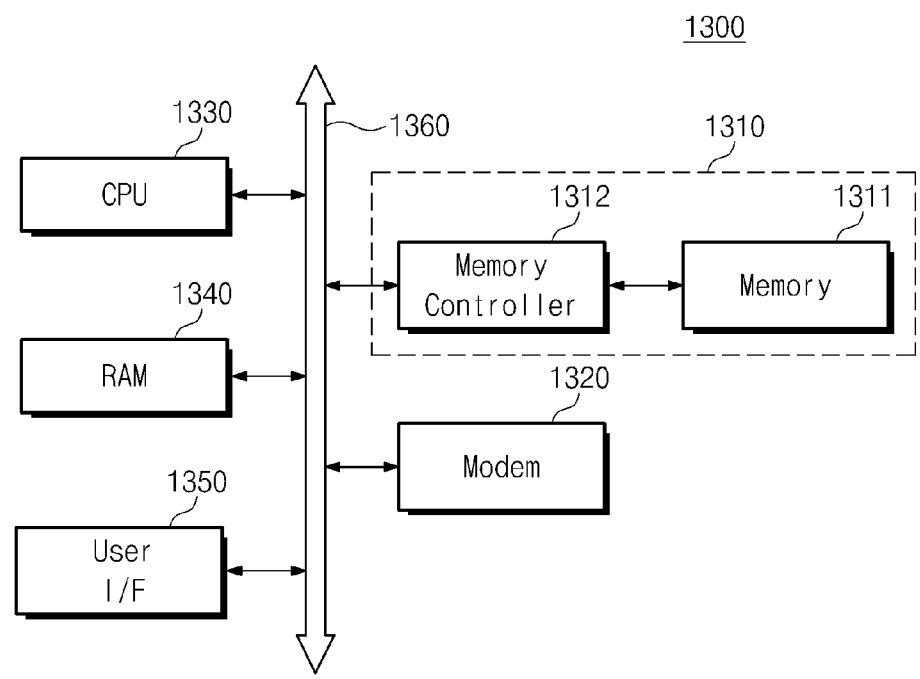
FIG. 10B is a schematic block diagram illustrating an example of information process system including a semiconductor device according to some exemplary embodiments.

FIG. 10A is a schematic block diagram illustrating an example of memory cards including a semiconductor device according to exemplary embodiments. FIG. 10B is a schematic block diagram illustrating an example of information process system including a semiconductor device according to exemplary embodiments.

Referring to FIG. 10A, a memory 1210 including at least one of the semiconductor devices 1, 1a, 1b, 2, 3, 4, 4a according to exemplary embodiments is applicable to a memory card 1200. For example, the memory card 1200 may include a memory controller 1220 generally controlling data exchange between a host 1230 and the memory 1210. An SRAM 1221 is used as a work memory of a central processing unit (CPU) 1222. The central processing unit may be, for example, a microprocessor or a microcontroller. A host interface 1223 has a data exchange protocol of the host 1230 connected to the memory card 1200. An error correction coding block 1224 detects and corrects errors of data that are read from the memory 1210. A memory interface 1225 interfaces the memory 1210. The CPU 1222 generally controls data exchange of the memory controller 1220.

Referring to FIG. 10B, an information processing system 1300 may include a memory system 1310 including at least one of the semiconductor devices 1, 1a, 1b, 2, 3, 4, 4a according exemplary embodiments. The information processing system 1300 may be realized as a mobile device or a computer. For example, the information processing system 1300 may include a modem 1320, a central processing unit (CPU) 1330, a RAM 1340, and a user interface 1350 electrically connected to the memory system 1310 via a system bus 1360. The CPU 1330 may be, for example, a microprocessor or a microcontroller. The memory 1310 may include a memory 1311 and a memory controller 1312 and have substantially the same configuration as that of the memory card 1200 in FIG. 10A. The memory system 1310 stores data processed by the CPU 1330 or data input from the outside. The information process system 1300 may be provided as a memory card, a solid state disk, a semiconductor device disk, a camera image sensor, and other application chipsets. In some exemplary embodiments, the memory system 1310 may be used as a portion of a solid state drive (SSD), and in this case, the information processing system 1300 may stably and reliably store a large amount of data in the memory system 1310.

According to exemplary embodiments described above, the thinned wafer can be easily handled without a carrier such that the provision of a separate carrier process may be eliminated. Moreover, burden of a via process can be alleviated because the through-electrode is formed after the wafer is thinned. Further, the alignment of the through-electrodes can be easily accomplished and a process for bump between the stacked chips can be skipped. Consequently, processes become simpler, process cost is reduced, and electrical characteristics are improved.

Although the present inventive concept has been described in connection with certain exemplary embodiments illustrated in the accompanying drawings, it is not limited thereto. It will be apparent to those skilled in the art that various substitution, modifications and changes may be thereto without departing from the scope and spirit of the present inventive concept.

What is claimed is:

1. A semiconductor device comprising:
a first semiconductor chip including a first integrated circuit on which a first top pad is directly provided;
a second semiconductor chip including a second integrated circuit on which a second top pad is directly provided and a second inactive surface on which a second bottom pad is provided, the second semiconductor chip being stacked on the first semiconductor chip with the second integrated circuit facing the first integrated circuit; and
a conductive interconnection configured to electrically connect the first semiconductor chip to the second semiconductor chip,
wherein the conductive interconnection comprises:
a first through-electrode that penetrates the second semiconductor chip and electrically connects the second bottom pad to the second top pad; and
a second through-electrode that penetrates the second semiconductor chip, passes through a horizontal plane of the second top pad without contacting the second top pad, and electrically connects the second bottom pad to the first top pad.

2. The semiconductor device of claim 1, wherein:
the second top pad has an L shape having a first portion extending in a first horizontal axis and a second portion extending in a second horizontal axis perpendicular to the first horizontal axis, and
the second through-electrode vertically extends between the first and second portions.

3. The semiconductor device of claim 2, wherein the second bottom pad has an L shape that is horizontally rotated 90 degrees relative to the L-shape of the second top pad, and the second bottom pad is vertically aligned with the second top pad.

4. The semiconductor device of claim 3, wherein:
the second through-electrode is provided between the first top pad and the second bottom pad, and
the first and second through-electrodes are arranged spaced apart from each other along at least one of the first and second horizontal axes.

5. The semiconductor device of claim 3, wherein:
the second through-electrode is provided between the first top pad and the second bottom pad, and
the first and second through-electrodes are arranged spaced apart from each other along a diagonal horizontal axis between the first and second horizontal axes.

6. The semiconductor device of claim 1, further comprising an insulating adhesive layer interposed between the first integrated circuit of the first semiconductor chip and the second integrated circuit of the second semiconductor chip,
wherein the second through-electrode further penetrates the insulating adhesive layer to be connected to the first top pad.

7. The semiconductor device of claim 1, wherein the first semiconductor chip has a thickness identical to or greater than a thickness of the second semiconductor chip.

8. The semiconductor device of claim 1, wherein the first semiconductor chip further comprises:
a first bottom pad on a first inactive surface opposite the first integrated circuit; and
a through-electrode that penetrates the first semiconductor chip and electrically connects the first top pad to the first bottom pad.

9. The semiconductor device of claim 1, further comprising a third semiconductor chip including a third integrated circuit on which a third top pad is disposed and a third inactive surface on which a third bottom pad is disposed, the third semiconductor chip being stacked on the second semiconductor chip with the third integrated circuit facing the second inactive surface,
wherein the conductive interconnection further comprises:
a third through-electrode that penetrates the third semiconductor chip and electrically connects the third bottom pad to the third top pad; and
a fourth through-electrode that penetrates the third semiconductor chip, passes through a horizontal plane of the third top pad without contacting the third top pad, and electrically connects the third bottom pad to the second bottom pad.

10. The semiconductor device of claim 9, wherein:
the third top pad has an L shape having a first portion extending in a first horizontal axis and a second portion extending in a second horizontal axis perpendicular to the first horizontal axis, and
the fourth through-electrode vertically extends between the first and second portions.

11. The semiconductor device of claim 10, wherein the second bottom pad has an L shape that is horizontally rotated 90 degrees relative to the L-shape of the third top pad along one of the first and second horizontal axes, and the second bottom pad is vertically aligned with the third top pad.

12. The semiconductor device of claim 9, further comprising an insulating adhesive layer interposed between the second inactive surface of the second semiconductor chip and the third integrated circuit of the third semiconductor chip,
wherein the fourth through-electrode further penetrates the insulating adhesive layer to be connected to the second bottom pad.

13. The semiconductor device of claim 9, wherein the first semiconductor chip has a thickness greater than a thickness of at least one of the second semiconductor chip and the third semiconductor chip.

14. A method of fabricating a semiconductor device, the method comprising:
providing a first semiconductor chip including a first integrated circuit on which a first top pad is directly disposed and a first inactive surface opposite the first integrated circuit;
forming a first adhesive layer on the first integrated circuit of the first semiconductor chip;
providing on the first adhesive layer a second semiconductor chip including a second integrated circuit on which a second top pad is directly disposed and a second inactive surface opposite the second integrated circuit such that the second integrated circuit faces the first integrated circuit;
grinding the second inactive surface to thin the second semiconductor chip;
forming a first conductive interconnection including a first through-electrode that penetrates the thinned second semiconductor chip and is connected to the second top pad, and a second through-electrode that penetrates the thinned second semiconductor chip and the first adhesive layer, and is connected to the first top pad; and
forming a second bottom pad on the grinded second inactive surface, the second bottom pad being connected to the first conductive interconnection,
wherein the second through-electrode passes through a plane of the second top pad without contacting the second top pad.

15. The method of claim 14, wherein the forming the first conductive interconnection comprises:
selectively etching the thinned second semiconductor chip and the first adhesive layer to form a via hole including a first hole that penetrates the second semiconductor chip to expose the second top pad and a second hole that penetrates the second semiconductor chip and the first adhesive layer to expose the first top pad;

forming a via insulating layer extending along an inner side of the via hole and covering the grinded second inactive surface;

removing a portion of the via insulating layer to expose a portion of the second top pad and a portion of the first top pad;

forming a conductive layer filling the via hole on the grinded second inactive surface; and planarizing the conductive layer until the via insulating layer is exposed to form the first through-electrode filling the first hole and the second through-electrode filling the second hole.

16. The method of claim 15, wherein:

the second top pad has an L shape including a first portion extending in a first horizontal axis and a second portion extending in a second horizontal axis perpendicular to the first horizontal axis, and the second bottom pad has an L shape that is horizontally rotated 90 degrees relative to the L-shape of the second top pad and is vertically aligned with the second top pad.

17. The method of claim 16, wherein:

the first through-electrode is disposed between the second top pad and the second bottom pad, the second through-electrode is disposed spaced apart from the first though electrode between the second bottom pad and the first top pad, and the second through-electrode is arranged along one of the first and second horizontal axes from the first through-electrode, or along a diagonal horizontal axis between the first and second horizontal axes from the first through-electrode.

18. A method for fabricating a semiconductor device, the method comprising:

providing a first semiconductor chip comprising a first substrate, a first integrated circuit disposed on a surface of the first substrate, and a first top pad disposed directly on the first integrated circuit, the first substrate having a first thickness;

forming a first adhesive layer on a surface of the first semiconductor chip;

adhering on the first adhesive layer a second semiconductor chip comprising a second substrate, a second integrated circuit provided on the second substrate, and a second top pad disposed directly on the second integrated circuit, such that the second integrated circuit and the second top pad face the first integrated circuit and the first top pad, respectively, the second semiconductor chip having a second thickness;

after the adhering the second semiconductor chip on the first semiconductor chip, grinding the second substrate to reduce the second thickness to a third thickness;

forming a first conductive interconnection including a short through-electrode that penetrates the second semiconductor chip to connect to the second top pad, and a second through-electrode that penetrates the second semiconductor chip and the first adhesive layer to connected to the first top pad; and forming a second bottom pad on a surface of the second substrate opposite to a surface adhered to the first semiconductor chip, the second bottom pad being connected to the first conductive interconnection.

19. The method according to claim 18, further comprising after the adhering the second semiconductor chip on the first semiconductor chip, forming the first conductive interconnection, and forming the second bottom pad, grinding the first substrate to reduce the first thickness to a fourth thickness.

20. The method according to claim 18, wherein the first thickness is a thickness greater than or equal to that of a semiconductor chip carrier.

21. A semiconductor device comprising:

a first semiconductor chip including a first integrated circuit on which a first top pad is directly provided;

a second semiconductor chip including a second integrated circuit on which a second top pad is directly provided and a second inactive surface on which a second bottom pad is provided, the second semiconductor chip being stacked on the first semiconductor chip with the second integrated circuit facing the first integrated circuit; and a conductive interconnection configured to electrically connect the first semiconductor chip to the second semiconductor chip, wherein the conductive interconnection comprises:

a first through-electrode that penetrates the second semiconductor chip and electrically connects the second bottom pad to the second top pad; and a second through-electrode that penetrates the second semiconductor chip, passes through a horizontal plane of the second top pad without contacting the second top pad, and electrically connects the second bottom pad to the first top pad, wherein the first and second through-electrodes are commonly connected to the second bottom pad.

* * * * *